United States Patent
Chen et al.

(10) Patent No.: US 10,730,276 B2
(45) Date of Patent: Aug. 4, 2020

(54) SYSTEM AND METHOD FOR VACUUM FILM LAMINATION

(71) Applicant: MAVEN OPTRONICS CO., LTD., Hsinchu County (TW)

(72) Inventors: Chieh Chen, Palo Alto, CA (US);
Chung-Shu Liao, New Taipei (TW);
Ping-Lin Wu, New Taipei (TW);
Hsiuwen Wang, Hsinchu (TW)

(73) Assignee: Maven Optronics Co., Ltd., Hsinchu County (TW)

( * ) Notice: Subject to any disclaimer, the term of this patent is extended or adjusted under 35 U.S.C. 154(b) by 240 days.

(21) Appl. No.: 15/863,761

(22) Filed: Jan. 5, 2018

(65) Prior Publication Data

US 2018/0201007 A1   Jul. 19, 2018

(30) Foreign Application Priority Data

Jan. 17, 2017   (CN) ........................ 2017 1 0031269
Jan. 17, 2017   (TW) ........................... 106101525 A

(51) Int. Cl.
*B29C 43/56*       (2006.01)
*B32B 37/10*       (2006.01)
(Continued)

(52) U.S. Cl.
CPC ............. *B32B 37/10* (2013.01); *B32B 7/12* (2013.01); *B32B 37/003* (2013.01);
(Continued)

(58) Field of Classification Search
CPC ........................ B32B 2309/68; B32B 43/56
See application file for complete search history.

(56) References Cited

U.S. PATENT DOCUMENTS 3,691,629 A * 9/1972 Schierz ............... H01L 21/4842
                                                       438/112
4,806,195 A * 2/1989 Namysl .................. B29C 43/56
                                                       100/269.02
(Continued)

FOREIGN PATENT DOCUMENTS

CN   101997089 A   3/2011
CN   205441130 U   8/2016
(Continued)

OTHER PUBLICATIONS

Partial Search Report for corresponding EP Patent Application No. 18150691.6, dated Jun. 1, 2018, 8 pages.
(Continued)

*Primary Examiner* — Scott W Dodds
(74) *Attorney, Agent, or Firm* — Foley & Lardner LLP

(57) ABSTRACT

A vacuum system for film lamination, including a vacuum chamber module, a film-pressing module, a substrate susceptor module and a hot-plate heating module, is disclosed, wherein the film-pressing module includes a film-pressing platen, and the substrate susceptor module includes a substrate susceptor supported by a spring-loaded mechanism. During a film-lamination process, the film-pressing platen is actuated to move downwards to attach a laminating film onto a substrate, and the substrate susceptor is actuated to move downwards and finally rest on the hot-plate heating module. Therefore an adhesive glue disposed between the laminating film and the substrate can be thermally cured. After completing the film-lamination process, the film-pressing platen is actuated upwards so that the substrate susceptor also is actuated to move upwards to its initial position by a restoring force exerted by the spring-loaded mechanism. In such manner, the laminating film can be (Continued)

properly bonded to the substrate to avoid lamination defects such as air bubbles and to improve adhesion strength.

8 Claims, 24 Drawing Sheets

(51) Int. Cl.
*B32B 7/12* (2006.01)
*B32B 37/06* (2006.01)
*B32B 37/00* (2006.01)
*H01L 27/15* (2006.01)
*H01L 33/50* (2010.01)
*H01L 21/67* (2006.01)
*B32B 37/12* (2006.01)
*B32B 39/00* (2006.01)
*B32B 41/00* (2006.01)
*H01L 33/60* (2010.01)
*B32B 38/00* (2006.01)
*H01L 25/075* (2006.01)

(52) U.S. Cl.
CPC .......... *B32B 37/0046* (2013.01); *B32B 37/06* (2013.01); *B32B 37/1009* (2013.01); *B32B 37/12* (2013.01); *B32B 39/00* (2013.01); *B32B 41/00* (2013.01); *H01L 21/6719* (2013.01); *H01L 21/67092* (2013.01); *H01L 21/67132* (2013.01); *H01L 27/156* (2013.01); *H01L 33/502* (2013.01); *B29C 43/56* (2013.01); *B32B 37/1207* (2013.01); *B32B 2037/1253* (2013.01); *B32B 2038/0076* (2013.01); *B32B 2309/68* (2013.01); *B32B 2457/00* (2013.01); *B32B 2457/14* (2013.01); *H01L 25/0753* (2013.01); *H01L 33/50* (2013.01); *H01L 33/60* (2013.01); *H01L 2933/0033* (2013.01); *H01L 2933/0041* (2013.01); *H01L 2933/0058* (2013.01)

(56) References Cited

U.S. PATENT DOCUMENTS

| | | | | |
|---|---|---|---|---|
| 8,708,021 B2 * | 4/2014 | Matsumura | ............. | H01L 24/75 100/260 |
| 2007/0125495 A1 * | 6/2007 | Nakamura | .......... | B32B 38/1841 156/382 |
| 2012/0247664 A1 * | 10/2012 | Kobayashi | .............. | H01L 24/75 156/285 |
| 2013/0139949 A1 | 6/2013 | Obuse et al. | | |

FOREIGN PATENT DOCUMENTS

| | | |
|---|---|---|
| JP | 2002-036272 A | 2/2002 |
| KR | 2009-0016440 A | 2/2009 |
| KR | 2010-0081864 A | 7/2010 |
| TW | 201323214 A | 6/2013 |
| TW | 201347971 A | 12/2013 |
| TW | I560062 B | 12/2016 |
| WO | WO-2007/142290 A1 | 12/2007 |

OTHER PUBLICATIONS

Office Action for corresponding Japanese Patent Application No. 2018-005468, dated May 7, 2019, 6 pages.

Office Action for corresponding Korean Patent Application No. 10-2018-0005324, dated Jun. 17, 2019, 8 pages.

Office Action with search report in corresponding Taiwan Patent Application No. 106101525, dated Jun. 25, 2018, 9 pages.

Office Action for corresponding Chinese Patent Application No. 201710221269.X, dated Nov. 28, 2019.

* cited by examiner

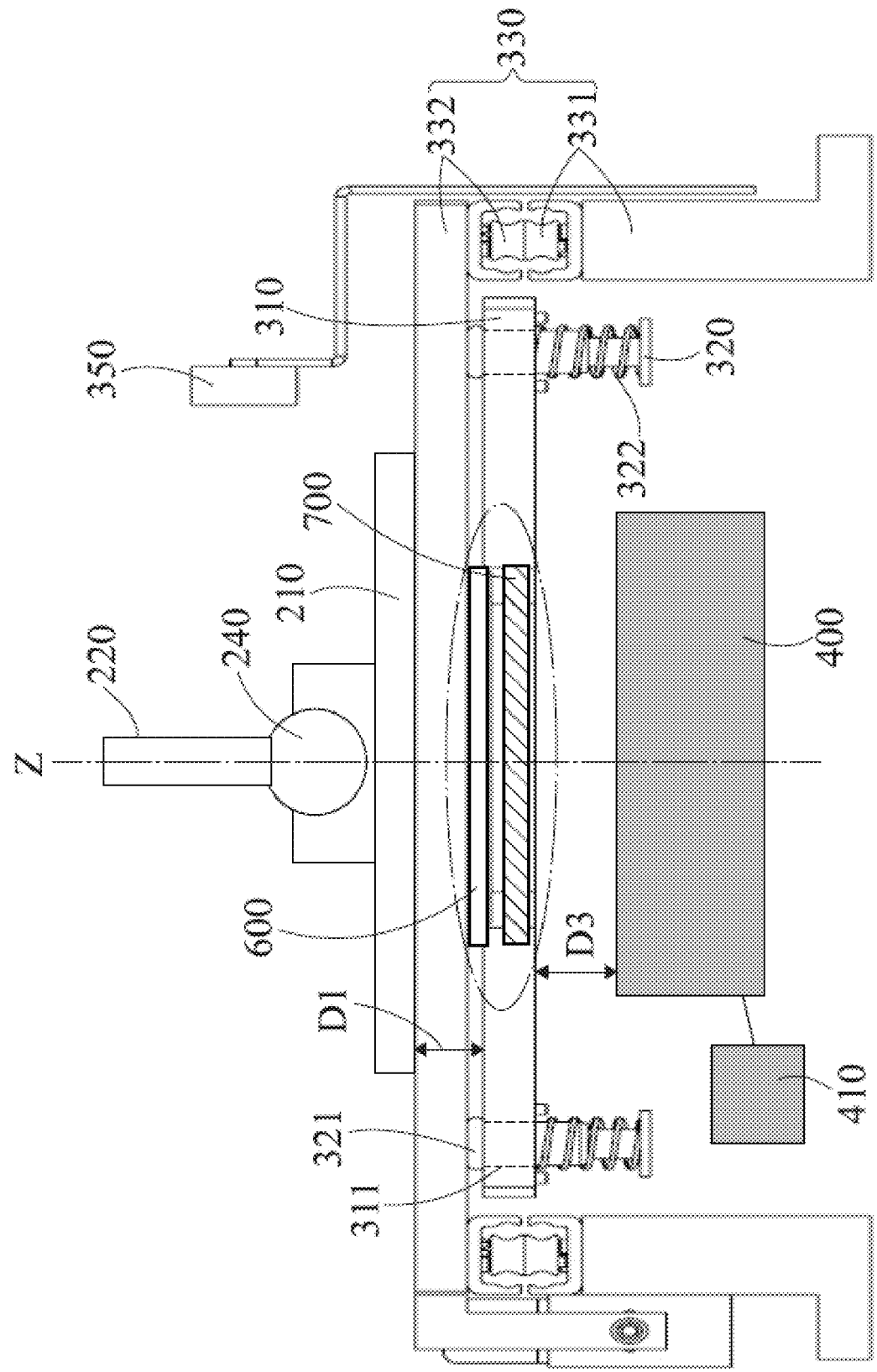

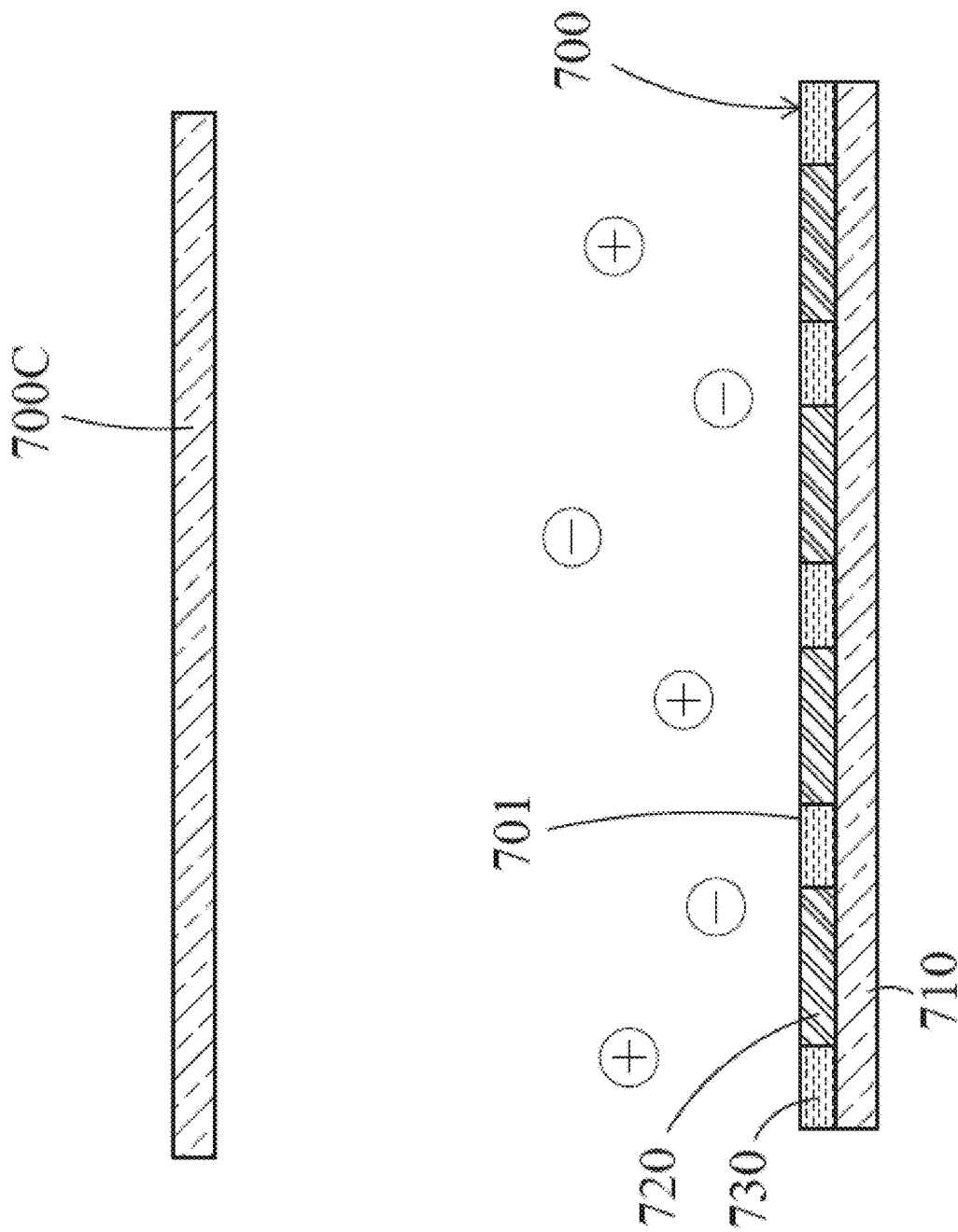

SYSTEM AND METHOD FOR VACUUM FILM LAMINATION

CROSS-REFERENCE TO RELATED APPLICATIONS

This application claims the benefit of and priority to Taiwan Patent Application No. 106101525 filed on Jan. 17, 2017, and Chinese Patent Application No. 201710031269.X filed on Jan. 17, 2017, the disclosures of which are incorporated herein by reference in their entirety.

BACKGROUND

Technical Field

The present disclosure relates to a system and a method for film lamination, and, in particular, to a system and a method to laminate a film onto a substrate in a vacuum environment.

Description of the Related Art

In the electronics industry, it is often desired to laminate various types of flexible or rigid films to electronic devices such as semiconductor components, electronic components (for example, integrated circuit (IC) resistors, IC capacitors, or other IC passive components, etc.) or liquid crystal display panels so that specific functions are achieved by laminating a desirable film to those electronic devices. For example, protective films are laminated to the electronic devices in order to have improved water resistance for the electronic devices.

Specifically, an optical film having desirable optical properties such as an optically transparent film, a translucent film or a color conversion film, may also be fabricated as a flexible or rigid film using resin materials. For example, the films may be included with dyes, light scattering particles, photo-luminescent materials or the like to obtain desirable optical properties such as color filtering, color conversion, brightness enhancement, or more uniform light diffusion. Therefore, an optical film may include a color filter film, a photo-luminescent film, a brightness enhancement film, or a diffuser film. The optical film is often fabricated as a stand-alone film first, and then laminated onto a variety of optoelectronic devices to achieve or improve certain desirable optical characteristics of the optoelectronic devices.

In particular, photo-luminescent materials, such as quantum dots, or phosphor, can be dispersed within a resin material to form a photo-luminescent film with specified color conversion capability. This kind of photo-luminescent film can be used in combination with a light emitting diode (LED) light source, or used in next generation displays. Alternatively, a photo-luminescent film for color conversion can be directly laminated to a blue LED semiconductor die to form a chip-scale-packaging white LED so that it has desirable photoelectric characteristics or performance. Therefore, an effective lamination method is desired to fabricate those optoelectronic devices.

Specifically, the lamination processes used to fabricate an LED light source by attaching a photo-luminescent film onto an LED chip can be categorized into "die-level bonding" or "wafer-level bonding" processes, respectively, which are described below.

A "die-level bonding" process refers to a fabrication process of laminating a chip-size photo-luminescent film on an LED chip. Because the size of the photo-luminescent film corresponding to the size of the LED chip is small, a high-precision film-lamination machine (or a pick-and-place machine) is usually utilized to accurately attach the photo-luminescent film to the LED chip. Therefore, "die-level bonding" equipment costs are high due to using high-precision placement machines. Moreover, due to the criteria of accurate alignment of the photo-luminescent film with the LED chip, and lamination of every single photo-luminescent film to a corresponding LED chip one at a time, the production yield of the "die-level bonding" is low and the production throughput is slow.

On the other hand, a "wafer-level bonding" process refers to a fabrication process of laminating a wafer-size photo-luminescent film on a plurality of LED chips simultaneously. Following the film-lamination process, a singulation process is usually used to separate the LED devices laminated with a chip-size film. Because a "wafer-level bonding" process may omit high-precision alignment of a laminating film to the LED chips, and a photo-luminescent film can be laminated on a plurality of LED chips in a batch manner, the equipment cost with high production efficiency can be relatively low.

It can be seen that a "wafer-level bonding" process has more advantages in terms of the equipment costs and production efficiency. However, the size of the laminating film involved in the "wafer-level bonding" process is usually larger. Because of variations during a manufacturing process, such as uneven thickness of the laminating film, non-parallel angle deviation of the laminating film relative to a chip surface during a lamination process, poor surface characteristics of a laminating film or other factors, some air bubbles could be trapped and remained inside a bonding adhesive glue, resulting in bonding defects, thereby reducing production yield.

Further, a typical film-lamination process is illustrated as follows. First, at least one of joining surfaces of a laminating film or a substrate surface of a device is disposed with an adhesive glue, and then the two joining surfaces are attached through the adhesive glue by pressing with force. Next, the adhesive is usually cured with heat or ultraviolet (UV) irradiation, so that the laminating film and the device are firmly bonded. However, if the adhesive glue is exposed to heat so that it is partially cured before the beginning of an attachment process, the bonding strength between the laminating film and the substrate surface will be affected, resulting in delamination.

In view of this, providing a cost-effective vacuum system with appropriate lamination methods to improve the afore-mentioned problems for the industry will be addressed.

SUMMARY

One object according to some embodiments of the present disclosure is to provide a vacuum system and a method for film lamination, which can avoid or reduce lamination defects by eliminating air bubbles trapped between a laminating film and a substrate so that the laminating film and the substrate can be tightly bonded together. An adhesive glue is thermally cured by heat inside a vacuum system as well. Therefore the bonding quality and the production yield can be improved.

Another object of the present disclosure is to provide a vacuum system and a method for film lamination, which can realize "wafer-level bonding", therefore having a lower equipment cost and/or a better productivity.

In order to achieve at least one of the above-mentioned objects, the vacuum system for film lamination according to some embodiments of the present disclosure includes a vacuum chamber module, a film-pressing module, a substrate susceptor module, and a hot-plate heating module. The vacuum chamber module includes a chamber defining an interior volume where a vacuum pressure in the interior volume can be properly adjusted and controlled. The film-pressing module includes a sliding rod penetrating through the chamber and connecting to a film-pressing platen disposed inside the chamber. The substrate susceptor module includes a spring-loaded mechanism and a substrate susceptor disposed on the spring-loaded mechanism. Before the beginning of a lamination process, the substrate susceptor is disposed in the interior volume of the chamber and maintained at an initial distance above the hot-plate heating module, which is disposed at a bottom surface of the interior volume of the chamber. During the lamination process, the substrate susceptor is actuated by the film-pressing platen to move downwards inside the chamber (or otherwise towards the hot-plate heating module); meanwhile, the spring-loaded mechanism is compressed when the substrate susceptor is actuated to move downwards. The substrate susceptor supported by the spring-loaded mechanism moves downwards and rests on the hot-plate heating module so that the substrate susceptor is heated by the hot-plate heating module. Therefore, an adhesive glue between a laminating film and a to-be-laminated substrate is fully cured and firmly bonded to complete the film-lamination process. Finally, the film-pressing platen is actuated to move upwards (or otherwise away from the hot-plate heating module) so that the previously stored potential energy during compression of the spring-loaded mechanism is released to actuate the substrate susceptor to move upwards and returning to its initial position maintaining the initial distance above the hot-plate heating module.

According to another aspect of the present disclosure, a film-lamination method according to some embodiments of the present disclosure comprises the operations of: maintaining a laminating film and a to-be-laminated substrate separated inside an interior volume of a chamber, wherein at least one of the laminating film or the to-be-laminated substrate is disposed with an adhesive glue; evacuating the interior volume of the chamber to a vacuum state; actuating the laminating film or the to-be-laminated substrate to move in a vacuum environment so that the laminating film is attached to the to-be-laminated substrate; and continuing to actuate the laminating film or the to-be-laminated substrate to move with a further distance to rest on a hot-plate heating module so that the adhesive glue is heated and thermally cured.

In this manner, the vacuum film-lamination system and the method of some embodiments of the present disclosure can provide at least the following benefits. First, a vacuum environment is provided to eliminate or reduce defects of air bubble trapped between the laminating film and the to-be-laminated substrate, thereby improving film lamination yield. Second, the adhesive glue is maintained with an initial distance away from the hot-plate heating module to avoid premature curing prior to the film attachment process, thereby reducing the bonding strength and the bonding quality. Third, the to-be-laminated substrate includes a plurality of chips and the like; therefore the vacuum system and the method can be used to realize a "wafer-level bonding" process.

Other aspects and embodiments of the disclosure are also contemplated. The foregoing summary and the following detailed description are not meant to restrict the disclosure to any 130 particular embodiment but are merely meant to describe some embodiments of the disclosure.

BRIEF DESCRIPTION OF THE DRAWINGS

FIG. 6A is a plan view illustrating some components of the vacuum film-lamination system shown in FIG. 1.

FIG. 9A, FIG. 9B, FIG. 9C, FIG. 9D, FIG. 9E, FIG. 10, FIG. 11, FIG. 12, FIG. 13A, FIG. 13B, FIG. 14A, FIG. 14B, FIG. 14C, FIG. 14D, FIG. 15A, and FIG. 15B are schematic views illustrating manufacturing stages of a vacuum film-lamination process using the vacuum film-lamination system shown in FIG. 1.

DETAILED DESCRIPTION

Definitions

Figure 1:
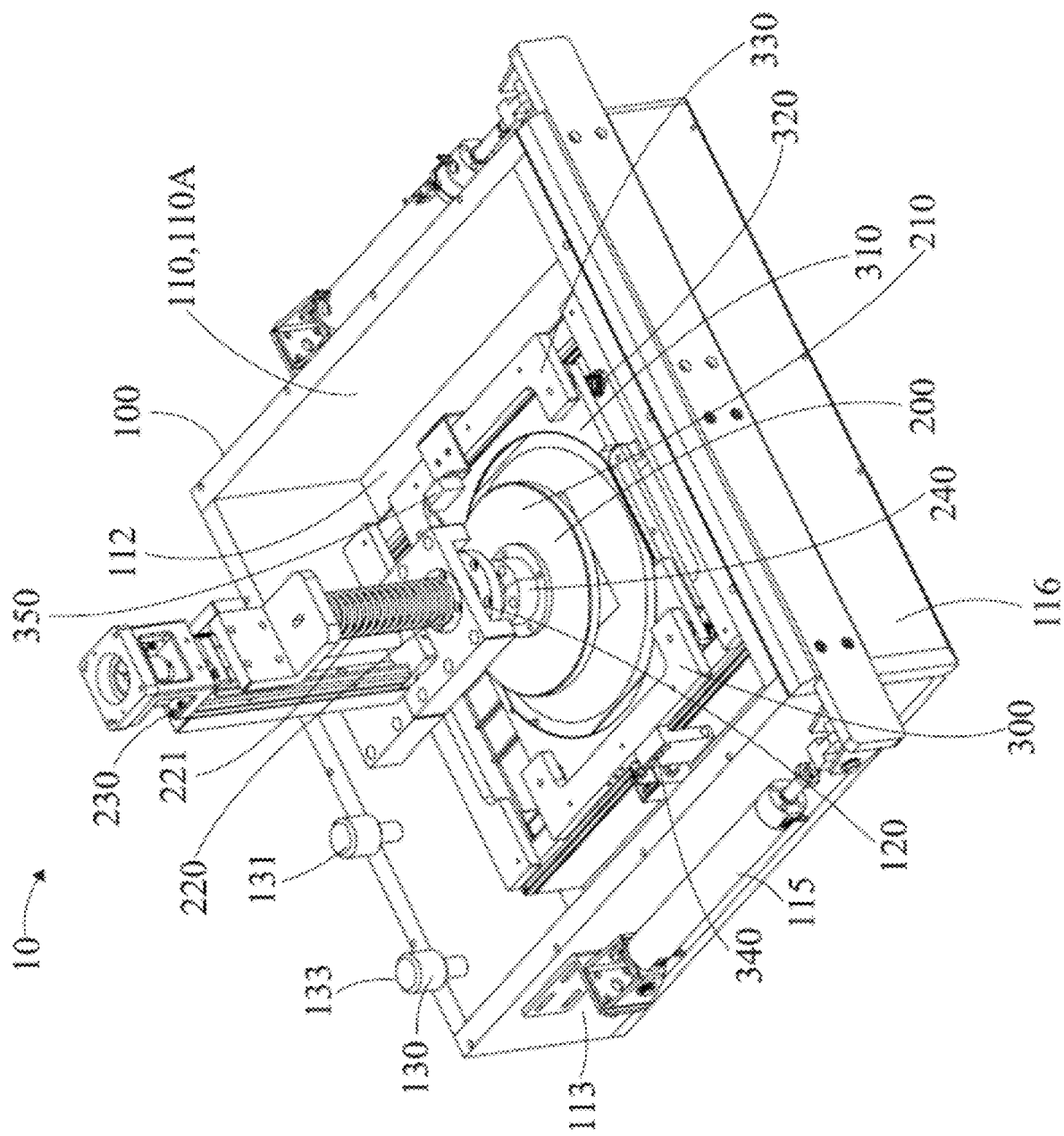
FIG. 1 is a perspective view illustrating a vacuum system for film lamination according to some embodiments of the present disclosure.

The following definitions apply to some of the technical aspects described with respect to some embodiments of the disclosure. These definitions may likewise be expanded upon herein.

As used herein, the singular terms "a," "an," and "the" may include plural referents unless the context clearly dictates otherwise. Thus, for example, reference to a layer can include multiple layers unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another. In the description of some embodiments, a component provided "on" or "on top of" another component can encompass cases where the former component is directly on (e.g., in direct physical contact with) the latter component, as well as cases where one or more intervening components are located between the former component and the latter component. In the description of some embodiments, a component provided "underneath" another component can encompass cases where the former component is directly beneath (e.g., in direct physical contact with) the latter component, as well as cases where one or more intervening components are located between the former component and the latter component.

As used herein, the terms "connect," "connected," and "connection" refer to an operational coupling or linking. Connected components can be directly coupled to one another or can be indirectly coupled to one another, such as via another set of components.

As used herein, the terms "about", "substantially", and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" transparent can refer to a light transmittance of at least 70%, such as at least 75%, at least 80%, at least 85% or at least 90%, over at least a portion or over an entirety of the visible spectrum.

As used herein with respect to photo-luminescence, the term "efficiency" or "quantum efficiency" refers to a ratio of the number of output photons to the number of input photons.

As used herein, the term "size" refers to a characteristic dimension. In the case of an object (e.g., a particle) that is spherical, a size of the object can refer to a diameter of the object. In the case of an object that is non-spherical, a size of the non-spherical object can refer to a diameter of a corresponding spherical object, where the corresponding spherical object exhibits or has a particular set of derivable or measurable characteristics that are substantially the same as those of the non-spherical object. When referring to a set of objects as having a particular size, it is contemplated that the objects can have a distribution of sizes around that size. Thus, as used herein, a size of a set of objects can refer to a typical size of a distribution of sizes, such as an average size, a median size, or a peak size.

Figure 2:
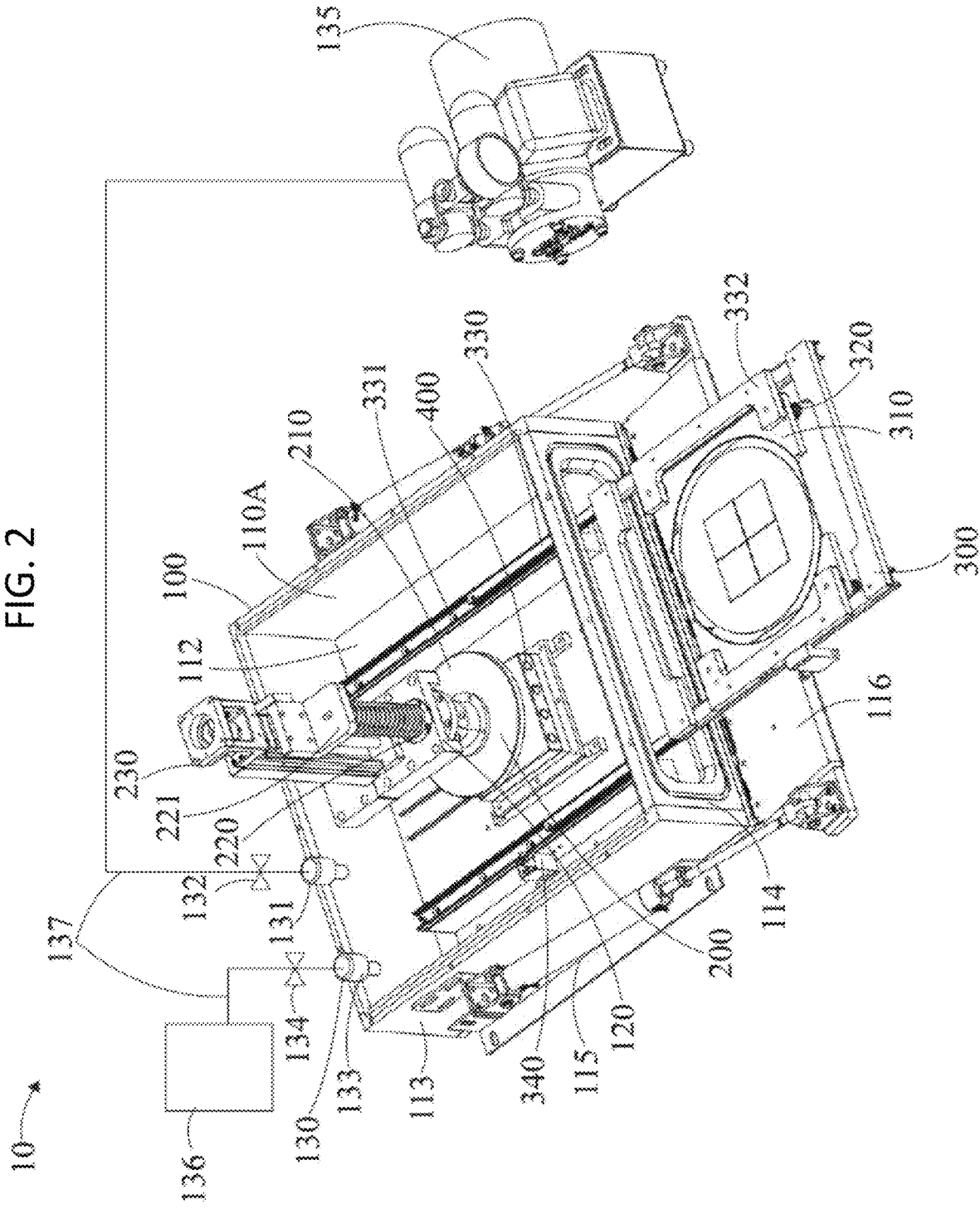
FIG. 2 is a perspective view illustrating the vacuum film-lamination system shown in FIG. 1, with a chamber door opened and a substrate susceptor slid out of a chamber.
Figure 3:
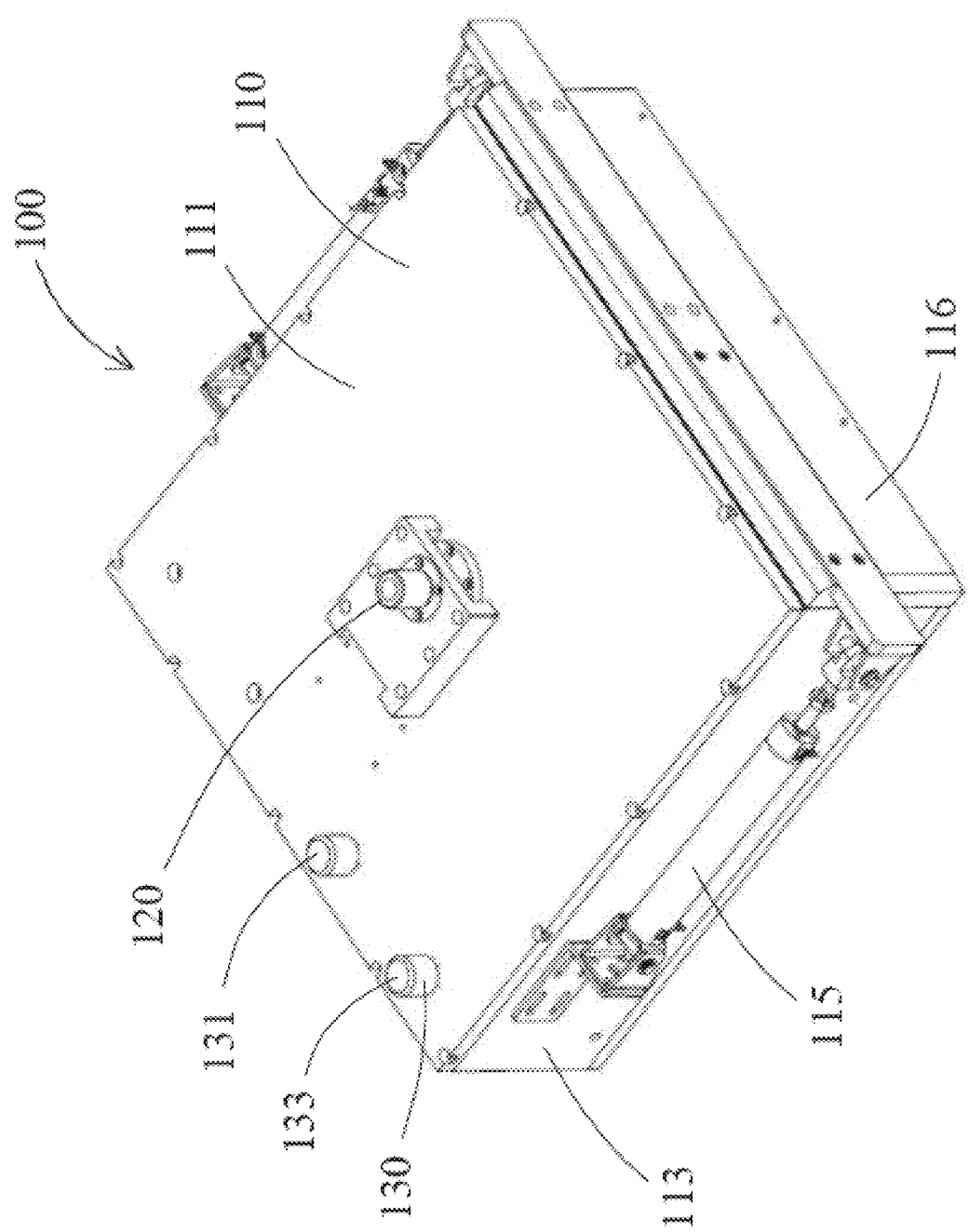
FIG. 3 is a perspective view illustrating a vacuum chamber module shown in FIG. 1.

FIG. 1 to FIG. 3 show schematic views of a vacuum film-lamination system 10 according to some embodiments of the present disclosure, where a top plate 111 of a chamber 110 as illustrated in FIG. 3 is not shown in FIG. 1 and FIG. 2 so that the internal structures of the vacuum film-lamination system 10 are better illustrated. The vacuum film-lamination system 10 comprises a vacuum chamber module 100, a film-pressing module 200, a substrate susceptor module 300, and a hot-plate heating module 400. The technical details of each module are described below.

The vacuum chamber module 100 provides a vacuum environment for the film lamination and includes a chamber 110, a vacuum feedthrough linear bearing 120, and a vacuum pressure control components assembly 130 of the vacuum system, wherein the vacuum feedthrough linear bearing 120 and the vacuum pressure control components assembly 130 are disposed on top of the chamber 110.

Specifically, the chamber 110 defines an interior volume 110A, where the vacuum pressure is controllable. That is, the pressure of the interior volume 110A can be controlled by the vacuum pressure control components assembly 130 of the vacuum system.

The chamber 110 may include a top plate 111, a bottom plate 112, three side plates 113 and a front side 114. The top plate 111 and the bottom plate 112 are disposed in parallel but oppositely facing each other. The side plate 113 and the front side 114 are disposed between the top plate 111 and the bottom plate 112, and the top plate 111 and the bottom plate 112 are assembled and connected hermetically. The top plate 111, the bottom plate 112, the side plate 113 and the front side 114 jointly define the interior volume 110A of the chamber, and the front side 114 has an opening to allow the interior volume 110A of the chamber to be vented to the ambient environment. Therefore, the front side 114 is sealed so that the interior volume 110A can be evacuated by pumping down to a vacuum state.

Accordingly, the vacuum chamber module 110 further includes a door actuator 115 and a chamber door 116 to seal the opening of the front side 114 when the chamber door 116 is closed. The door actuator 115 can be mounted on the side plate 113, while the chamber door 116 is disposed on the front side 114 and connected to the door actuator 115. The door actuator 115 (e.g., pneumatic cylinder, hydraulic cylinder, motor lead screw set, etc.) can move the chamber door 116 (e.g., rotate, swing, or slide, etc.) relative to the front side 114 so that the opening of the front side 114 (therefore the interior volume 110A of the chamber) is vacuum-sealed when the chamber door 116 is closed.

In other embodiments, the other side plate 113 may have openings to replace the front side 114, or the top plate 111 of the chamber 110 is movable (e.g., the top plate 111 may be lifted up and down to open or seal the chamber 110) such that the interior volume 110A of the chamber can communicate with or can be isolated from the outside atmospheric pressure environment.

Figure 4:
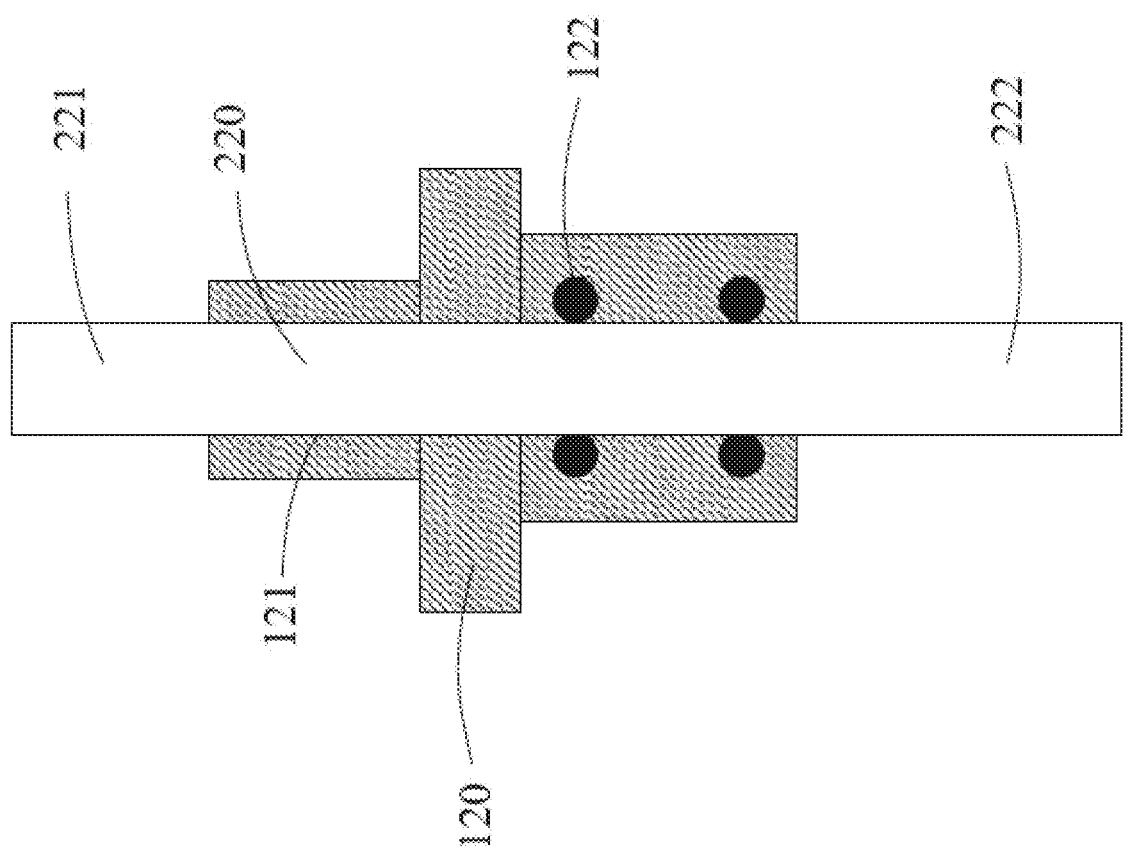
FIG. 4 is a plan view illustrating a vacuum feedthrough linear bearing shown in FIG. 1.

With reference to FIG. 4, the vacuum feedthrough linear bearing 120 can allow a sliding rod 220 of the film-pressing module 200, which will be described later, to slide vertically into the chamber 110 from the outside without breaking a vacuum state of the chamber 110. The vacuum feedthrough linear bearing 120 can be mounted and embedded into the top plate 111 (the top plate 111 has a mating through hole sized to accommodate the bearing 120) of the chamber 110 such that a portion of the vacuum feedthrough linear bearing 120 is disposed above the top plate 111 and located outside the interior volume 110A of the chamber 110, whereas another portion is disposed under the top plate 111 and located inside the interior volume 110A of the chamber 110. The vacuum feedthrough linear bearing 120 may also be completely disposed above or below the top plate 111.

Specifically, the vacuum feedthrough linear bearing 120 may include or define an axial through hole 121 and a vacuum seal 122, wherein the axial through hole 121 can communicate with the interior volume 110A of the chamber 110 and allows the sliding rod 220 to pass through to enter the interior volume 110A of the chamber 110. The vacuum seal 122 (e.g., an O-ring rubber seal, a magnetic shaft seal, a bellow, etc.) is disposed inside the axial through hole 121 and surrounds the sliding rod 220 to prevent the air from entering into the interior volume 110A of the chamber 110 through the axial gap between the vertical rod 220 and the through hole 121.

In other embodiments, the vacuum feedthrough linear bearing 120 can be omitted if the sliding rod 220 or the film-pressing module 200 can be completely disposed inside the chamber 110.

Referring to FIG. 2 and FIG. 3, the vacuum pressure control components assembly 130 of the vacuum system 10 can be used to control the pressure in the interior volume 110A of the chamber. The vacuum pressure control components assembly 130 can be disposed on the top plate 111 of the chamber 110, on the bottom plate 112, on the side plate 113 or the like, so that it is attached or connected to the chamber 110. The vacuum pressure control components assembly 130 may include a vacuum pressure sensor 131 and a vacuum pump isolation valve 132 connected to a vacuum pump 135, and an atmospheric pressure sensor 133 and a venting isolation valve 134 connected to a venting pressure source 136, respectively.

Specifically, the vacuum pump 135 is disposed outside the chamber 110. The vacuum pump isolation valve 132 and the vacuum pressure sensor 131 are connected in series through a vacuum pipe 137 to communicate with the interior volume 110A of the chamber 110. When the vacuum pump 135 is operated and the vacuum pump isolation valve 132 is opened while the venting isolation valve 134 is closed to isolate the chamber 110 from the venting pressure source 136, the pressure in the interior volume 110A of the chamber can be evacuated by pumping down to a vacuum state. The vacuum pressure sensor 131 can be used to detect the vacuum state of the chamber 110. When the vacuum state reaches a pre-set value, the vacuum pump isolation valve 132 is closed by a control module 500, which will be described later.

The venting pressure source 136 is also disposed outside the chamber 110. The venting isolation valve 134 and the atmospheric pressure sensor 133 are connected in series to the interior volume 110A of the chamber by another vacuum pipe 137. When the venting isolation valve 134 is opened while the vacuum pump isolation valve 132 is closed to isolate the chamber 110 from the vacuum pump 135, the venting air is supplied to the interior volume 110A of the chamber so that the chamber is vented to atmospheric pressure. The atmospheric pressure sensor 133 can detect whether the pressure in the interior volume 110A of the chamber has reached the atmospheric pressure (or the pre-set pressure). After the chamber 110 is vented to atmospheric pressure, the venting isolation valve 134 can be closed by the control module 500 to isolate the chamber 110 from the venting pressure source 136.

Figure 5:
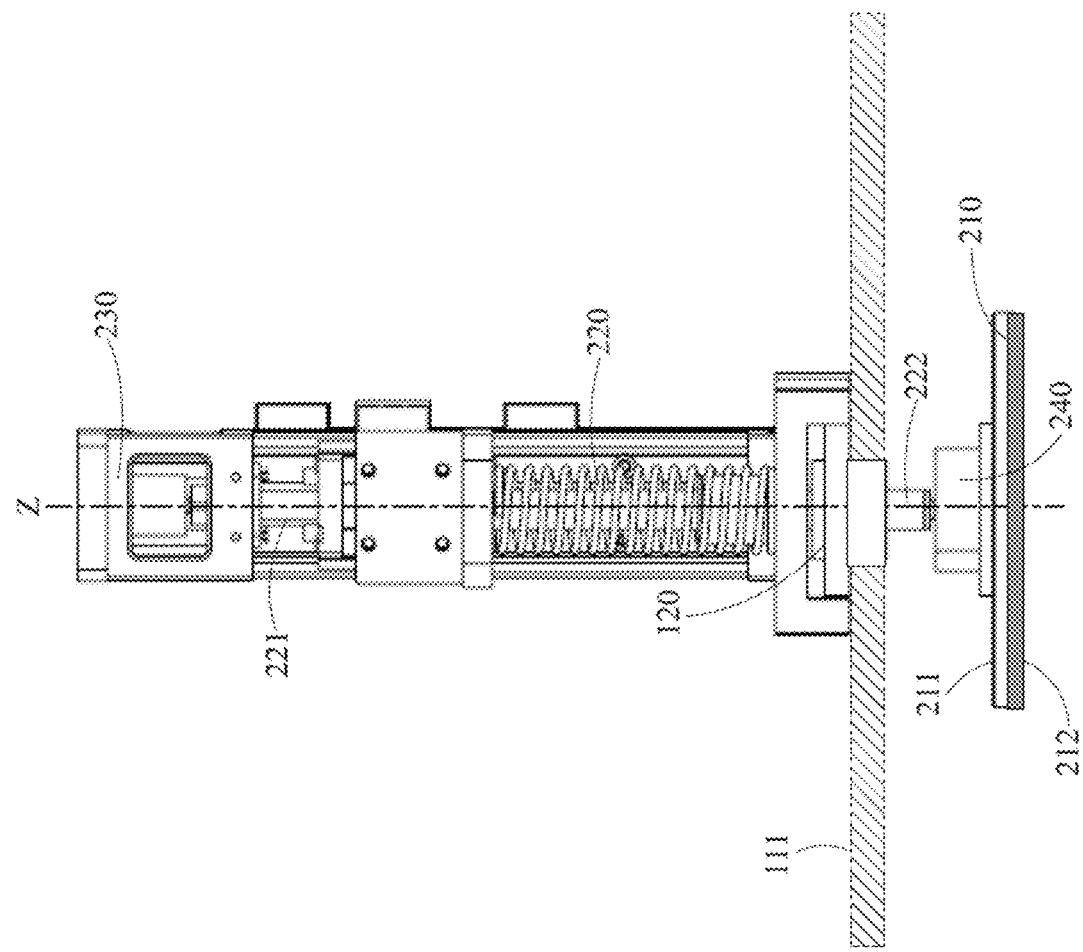
FIG. 5 is a plan view illustrating a film-pressing module shown in FIG. 1.
Figure 6B:
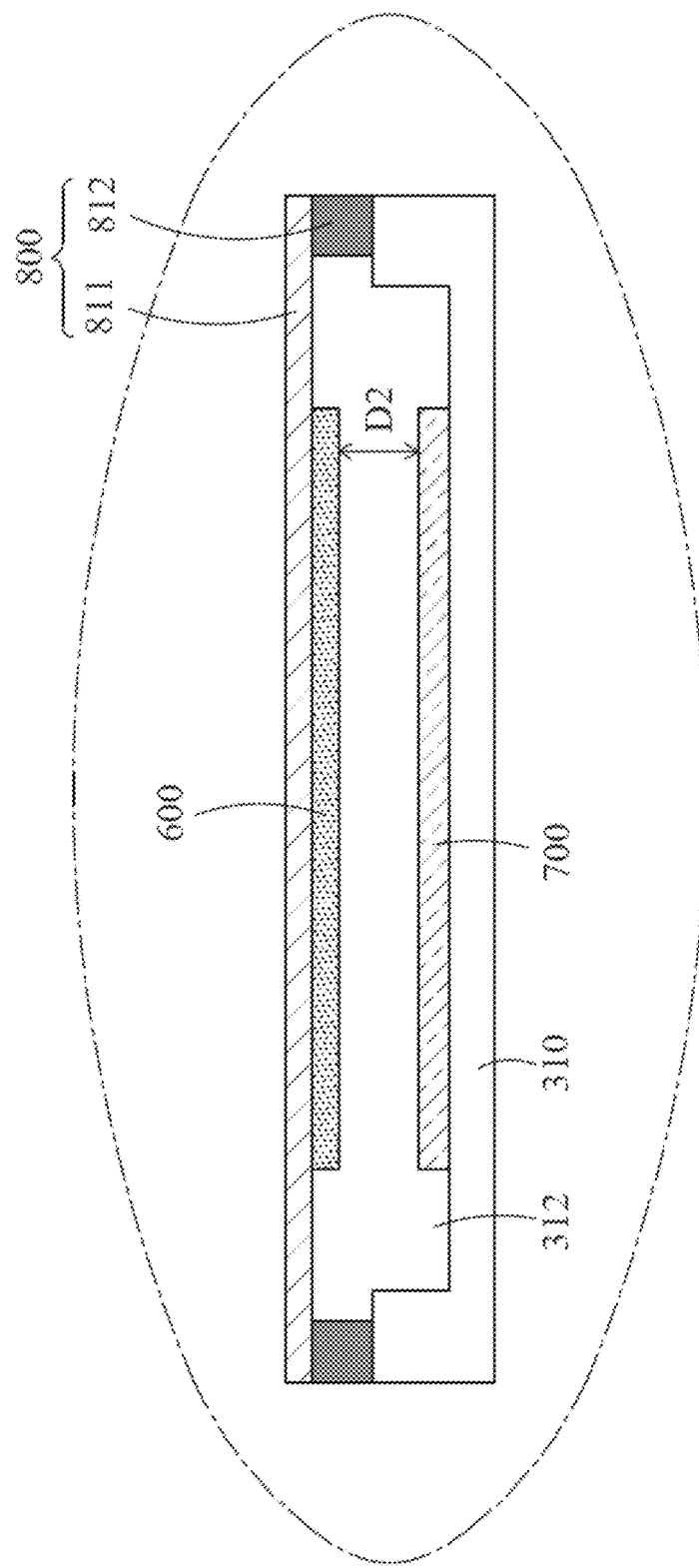
FIG. 6B is a partial enlarged view of FIG. 6A.

Next, some embodiments of the film-pressing module 200 will be described with reference to FIG. 5 (which shows the film-pressing module 200 mounted to the top plate 111). The film-pressing module 200 can press a laminating film 600 and a to-be-laminated substrate 700 (as shown in FIG. 6B and described in detail below), so that the two are attached together. The structure of the film-pressing module 200 can include a film-pressing platen 210, a sliding rod 220 and a pressing actuator 230. The pressing actuator 230 is connected to and can actuate the sliding rod 220, which in turn connects to the film-pressing platen 210, to move up and down inside the interior volume 110A of the chamber.

Specifically, the film-pressing platen 210 is disposed inside the interior volume 110A of the chamber 110. The sliding rod 220 further includes an upper rod (or upper rod portion) 221 and a lower rod (or lower rod portion) 222. The upper rod 221 is normally located above the top plate 111 and normally outside the interior volume 110A of the chamber 110, whereas the lower rod 222 is normally located under the top plate 111 and normally inside the interior volume 110A of the chamber 110. The film-pressing platen 210 is disposed on and connects to the lower rod 222. It can be seen that the middle portion of the sliding rod 220 is disposed inside the vacuum feedthrough linear bearing 120 and passes through the top plate 111 to slide vertically.

The pressing actuator 230 can be disposed above the top plate 111 and is connected to the upper rod 221 of the sliding rod 220 to actuate the sliding rod 220 to move along a vertical axis Z. The film-pressing platen 210 moves with the sliding rod 220 inside the interior volume 110A of the chamber 110. Embodiments of the pressing actuator 230 include any mechanical and/or electrical assembly providing linear motion, such as a motor and lead screw assembly, a linear motor assembly, a pneumatic cylinder assembly, a hydraulic cylinder assembly, a motor and linkage assembly or the like, that can provide at least one degree of freedom of motion along the vertical direction.

Preferably, the film-pressing platen 210 may include an upper platen 211 and a lower platen 212. The upper platen 211 is connected to the lower rod 222 of the sliding rod 220, and the lower platen 212 is disposed under the upper platen 211. The upper platen 211 is desirably made of a sufficiently rigid material (e.g., stainless steel) so that it is not readily bent and deformed, while the lower platen 212 is desirably made of a softer material (e.g., resin, rubber, polymer, etc.) as a buffer layer. In this arrangement, when the film-pressing platen 210 presses the laminating film 600 against the to-be-laminated substrate 700, the upper platen 211 can withstand a force exerted from the sliding rod 220 without being deformed, and the lower platen 212 acting as a buffer layer can uniformly distribute the force onto the laminating film 600 and the to-be-laminated substrate 700 so that the laminating film is evenly attached to the substrate 700 without damaging the laminating film 600 and/or the to-be-laminated substrate 700 by avoiding local force concentration during the force pressing operation.

Next, some embodiments of the substrate susceptor module 300 will be described. Referring to FIG. 6A and FIG. 6B, the substrate susceptor module 300 can carry the laminating film 600 and the to-be-laminated substrate 700, wherein the laminating film 600 and the to-be-laminated substrate 700 can be exchanged in position relative to each other and are disposed in the interior volume 110A of the chamber 100. The substrate susceptor module 300 can further comprise a substrate susceptor 310, a spring-loaded mechanism 320, and a sliding rail 330. The substrate susceptor 310 is disposed on and connected to the spring-loaded mechanism 320, whereas the spring-loaded mechanism 320 is disposed on and connected to the sliding rail 330.

More specifically, the substrate susceptor 310 is used to carry and hold the laminating film 600 and the to-be-laminated substrate 700, and can be embodied as a plate with a plurality of through holes 311. The spring-loaded mechanism 320 can have a plurality of spring shafts 321 and a plurality of springs 322, wherein the spring shafts 321 pass through the through holes 311 and the springs 322 are sleeved on the spring shafts 321. One end of each spring 322 supports the substrate susceptor 310. The spring 322 may be a compression spring or a tension spring. When no external force is applied (when the film-lamination process has not started), the substrate susceptor 310 may have an initial compression position on the spring 322 by its own weight and maintains an initial distance D1 from the film-pressing platen 210 along the vertical axis Z so that these two components do not touch with each other.

The sliding rail 330 may have a rail portion 331 and a slide portion 332. The rail portion 331 is disposed and fixed inside the chamber 110, whereas the slide portion 332 is disposed on the rail portion 331 so that it can move linearly along a rail guide. The spring shaft 321 of the spring-loaded mechanism 320 is disposed and fixed on the slide portion 332 so that the substrate 350 susceptor 310 and the spring-loaded mechanism 320 can move horizontally along the slide portion 332 inside the interior volume 110A of the chamber (a horizontal axis that is perpendicular to the vertical axis Z). Additionally, when the front side 114 is open by actuating the chamber door 116, the substrate susceptor 310 can be slid to the outside of the chamber 110 for placing the laminating film 600 and the to-be-laminated substrate 700 on the substrate susceptor 310 or for taking the laminated substrate out of the chamber 110.

The laminating film 600 can be disposed on a holder frame 800 and then indirectly placed on the substrate susceptor 310 through the holder frame 800. The substrate susceptor 310 can have a recessed pocket 312 for accommodating the to-be-laminated substrate 700 so that the laminating film 600 is separated from the to-be-laminated substrate 700 by an initial distance D2. The holder frame 800 comprises an adhesive tape 811 (e.g., a dicing tape or a blue tape) and a supporting frame 812. The adhesive tape 811 is disposed on the supporting frame 812, and the laminating film 600 can be adhered to the adhesive tape 811 inside the supporting frame 812.

The substrate susceptor module 300 desirably includes a susceptor presence sensor 340 (shown in FIG. 1) and a film presence sensor 350. The susceptor presence sensor 340 can be used to detect whether the substrate susceptor 310 is positioned right below the film-pressing platen 210. The susceptor presence sensor 340 is disposed on or around the linear sliding path of the substrate susceptor 310 and may be embodied by a non-contact optical or magnetic sensor, such as a light blocking switch, a proximity switch, a reed switch, a reflective optical transceiver switch, or the like, to detect the position of the substrate susceptor 310. The susceptor presence sensor 340 may also be embodied by a contact mechanical sensor such as a limit switch or the like. The film presence sensor 350 may be used to detect whether the laminating film 600 (or the holder frame 800) is placed on the substrate susceptor 310 and is located above the substrate susceptor 310.

In other embodiments, the substrate susceptor 310 and the spring-loaded mechanism 320 may be fixed inside the interior volume 110A of the chamber 110 without sliding outside the chamber 110. Therefore, the sliding rail 330 and the susceptor presence sensor 340 may be omitted. Additionally, the film presence sensor 350 may also be omitted.

Next, some embodiments of the hot-plate heating module 400 will be described. As illustrated in FIG. 2 and FIG. 6A, the hot-plate heating module 400 can be made of electrical-resistant materials or heat-conducting materials such as a ceramic or a metal embedded with a heater inside. The hot-plate heating module 400 can be used to control and maintain itself at high temperature by way of electrical heating, infrared heating, induction heating or the like. A temperature sensor 410 is disposed to measure the temperature of the hot-plate heating module 400. The hot-plate heating module 400 is disposed inside the interior volume 110A of the chamber 110 and situated under the substrate susceptor 310. Before the film-pressing platen 210 starts to actuate the substrate susceptor 310 to move downwards, the hot-plate heating module 400 and the substrate susceptor 310 maintain a gap with an initial distance D3 so that these two components do not contact each other.

It can be seen from the above that the film-pressing platen 210, the substrate susceptor 310, and the hot-plate heating module 400 are all disposed inside the interior volume 110A of the chamber 110 and arranged in order along the vertical axis Z. More specifically, the film-pressing platen 210 is located above the substrate susceptor module 300, and the hot-plate heating module 400 is situated under the substrate susceptor 310, whereas the three components are separated with pre-defined initial distances D1 and D3, respectively, before the vacuum lamination process has started.

After the vacuum chamber 100 is evacuated by pumping down to a vacuum state and when the vacuum film-lamination process begins, the film-pressing platen 210 can be actuated to move downwards to press the laminating film 600 against the to-be-laminated substrate 700, both of which are attached on the substrate susceptor 310. Subsequently, the substrate susceptor 310 will continue to be actuated to move downwards for a further distance D3 till the substrate susceptor 310 rests on and contacts the hot-plate heating module 400. Therefore, the laminating film 600, the to-be-laminated substrate 700, as well as the substrate susceptor 310 are heated by the hot-plate heating module 400 so that the adhesive glue is cured after the laminating film 600 is vacuum attached onto the to-be-laminated substrate 700. Through this procedure, the adhesive glue is prevented from being pre-heated and therefore pre-cured before the laminating film 600 is completely vacuum-attached onto the to-be-laminated substrate 700. This lamination procedure is advantageous because a pre-cured adhesive may result in poor bonding strength. When the substrate susceptor 310 is actuated to rest on the hot-plate heating module 400, each spring 322 of the spring-loaded mechanism 320 is compressed (or stretched) by the substrate susceptor 310 so that a spring potential energy is stored. When the adhesive glue is substantially fully thermally cured to form good bonding strength between the film 600 and the substrate 700, the film-pressing platen 210 will be actuated to move upwards by the pressing actuator 230. At this time, the previously stored potential energy from the spring-loaded mechanism 320 can be released so that the substrate susceptor 310 is actuated to move upwards to its original position. In this way, the vacuum laminating system 10 according to some embodiments of the present disclosure may be used to sequentially complete the procedure of 1) attaching the film 600 and the substrate 700 under vacuum, and then 2) curing the adhesive glue between the film 600 and the substrate 700.

Figure 7A:
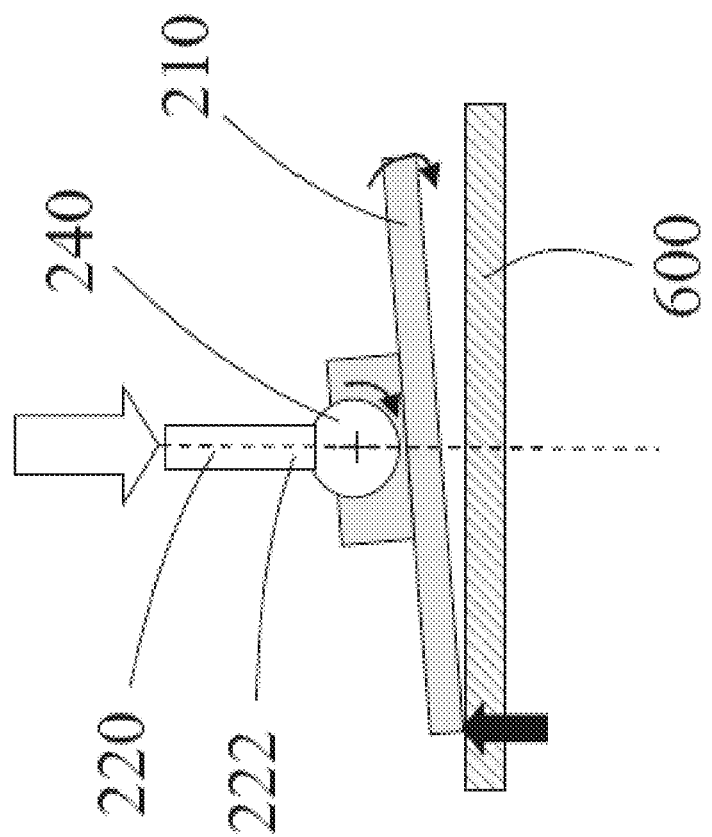
FIG. 7A and FIG. 7B are schematic views illustrating a film-pressing platen pressing the laminating film or the substrate susceptor shown in FIG. 1.
Figure 7B:
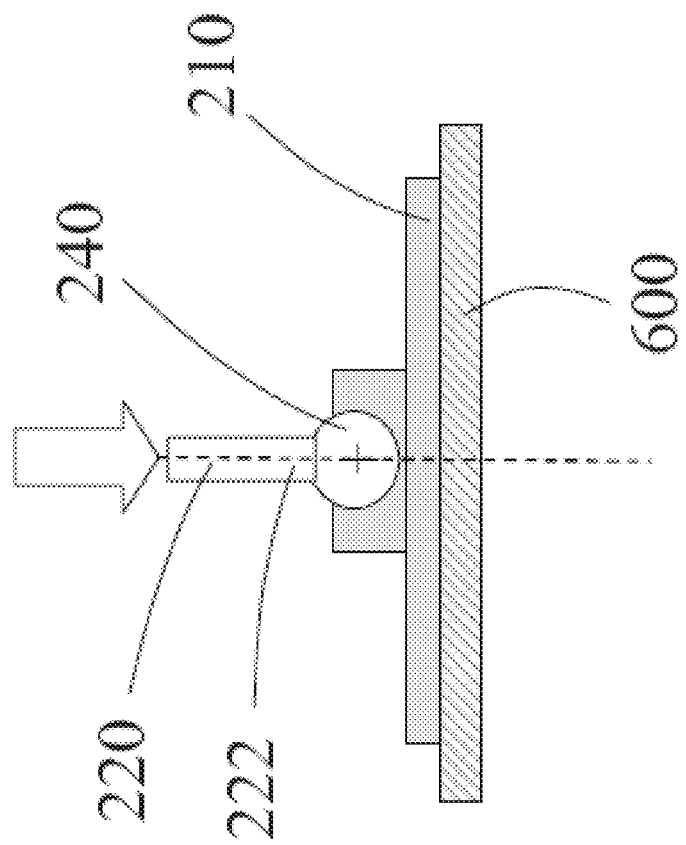

Referring to FIG. 7A and FIG. 7B, the lower rod 222 of the sliding rod 220 desirably includes a spherical joint 240 and the film-pressing platen 210 is attached to the lower rod 222 via the spherical joint 240 for allowing two-degrees-of-freedom free rotation. Therefore, the film-pressing platen 210 can be adjusted horizontally relative to the lower rod 222 during the film-lamination process so that the film-pressing platen 210 is substantially coplanar with the substrate susceptor 310. That is, the film-pressing platen 210 and/or the substrate susceptor 310 are aligned in parallel horizontally during the film-lamination process.

Even when the laminating film 600 or the holder frame 800 on the substrate susceptor 310 is not placed horizontally, the film-pressing platen 210 can adjust its horizontal angle to avoid the problem that a single side or a portion of the film-pressing platen 210 contacts the laminating film 600 locally, resulting in uneven pressing pressure and poor film attachment. Therefore, with the embodiments of the spherical joint 240 on the lower rod 222, the film-pressing platen 210 can adjust its horizontal angle to be aligned with the laminating film 600. As shown in FIG. 7A, with one side as a fulcrum, the other side of the film-pressing platen 210 can swing so that it is substantially aligned with the laminating film 600 (as illustrated in FIG. 7B). Therefore the film-pressing platen 210 can have full contact and evenly press the adhesive tape 811 together with the laminating film 600 to move downwards.

Figure 8:
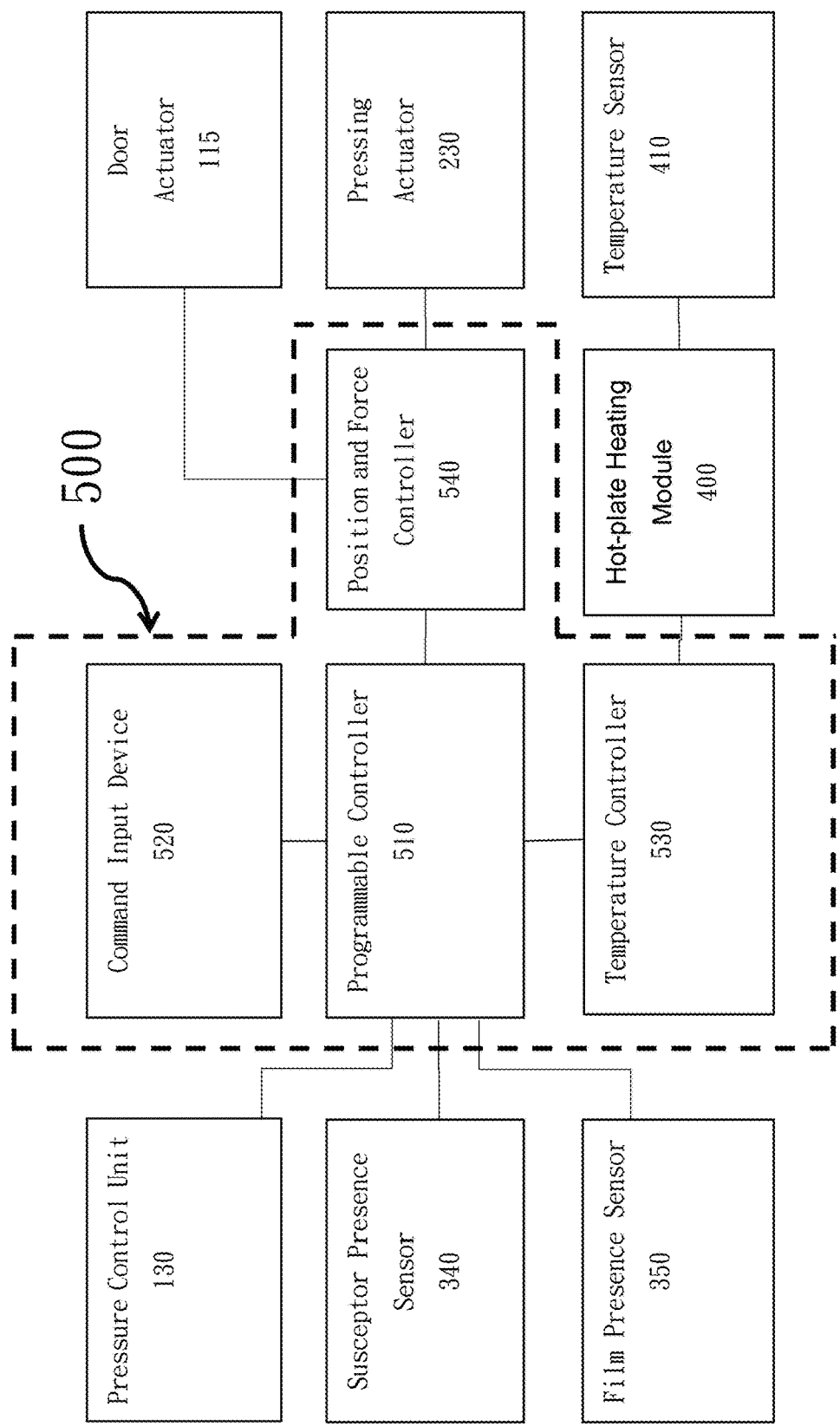
FIG. 8 is a functional block diagram illustrating a control module of the vacuum film-lamination system shown in FIG. 1.

Referring to FIG. 8, the vacuum film-lamination system 10 may further include a control module 500 to control and coordinate the operation of the vacuum chamber module 100, the film-pressing module 200, the substrate susceptor module 300, and the hot-plate heating module 400, to coordinate a vacuum film-lamination process via connections to these components.

The control module 500 may include components such as a programmable controller 510, a command input device 520, a temperature controller 530, and a position and force controller 540, all of which are electrically connected to the programmable controller 510. Further, the above-mentioned vacuum pressure sensor 131, the atmospheric pressure sensor 133, the susceptor presence sensor 340, the film presence sensor 350, the temperature sensor 410 and other sensors can all be electrically connected to the programmable controller 510. Therefore, the programmable controller 510 can control and coordinate the vacuum chamber module 100, the film-pressing module 200, the substrate susceptor module 300, and the hot-plate heating module 400 by commands and programs downloaded by the command input device 520 (such as a touch screen, a keyboard, etc.). Through a variety of vacuum pressure sensors, temperature sensors, position sensors, and the like, the programmable controller 510 can coordinate the timing of the various components in order to complete a vacuum film-lamination process.

The above is a description of some embodiments of the components of the vacuum film-lamination system 10. In the following paragraphs, some embodiments of a vacuum film-lamination process by using the vacuum film-lamination system 10 will be described.

Figure 9A:
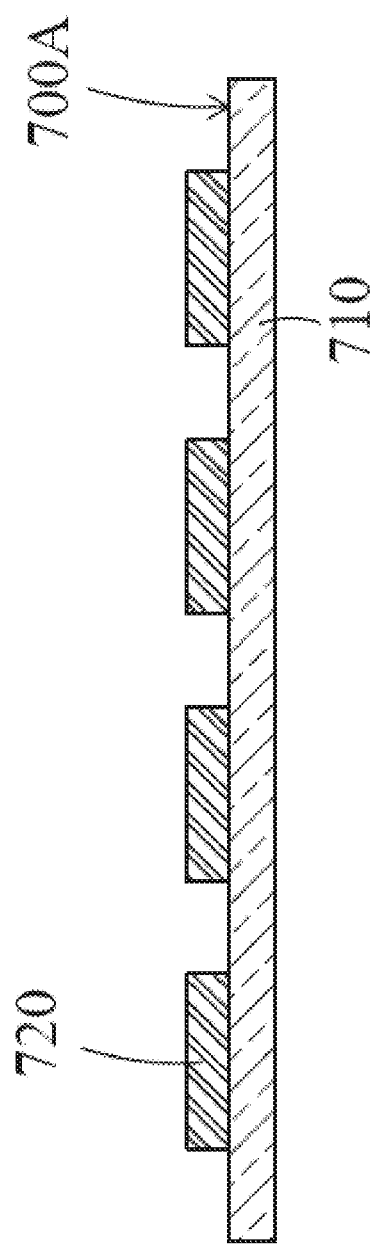
Figure 9B:
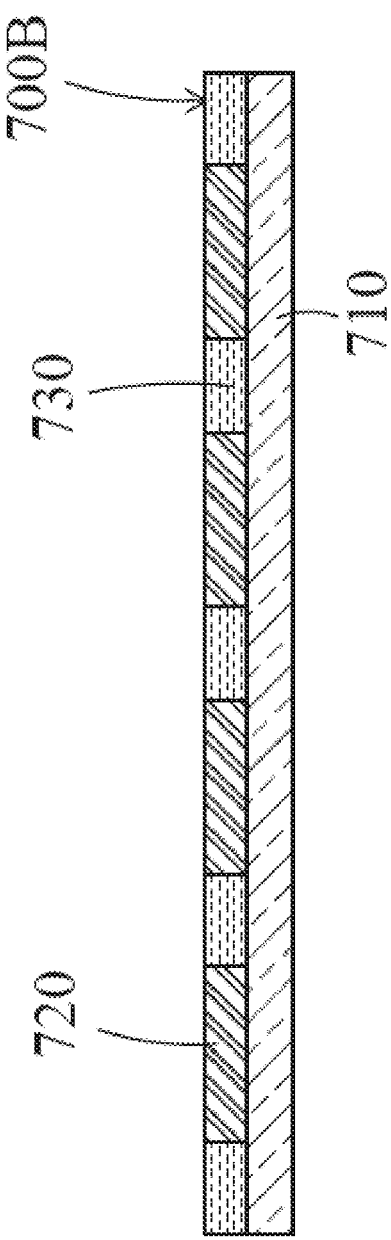

Before starting the vacuum film-lamination process, a to-be-laminated substrate 700 is prepared in advance. Referring to FIG. 9A, some embodiments of the to-be-laminated substrate 700 is an array of light-emitting semiconductor dies 700A, including a tape substrate 710 (such as a thermal release adhesive film, a UV release adhesive film, or other types of adhesive films, etc.) and a plurality of flip-chip light-emitting semiconductor dies 720 evenly spaced apart from one another and disposed or laminated to the tape substrate 710. Referring to FIG. 9B, other embodiments of the to-be-laminated substrate 700 is an array of flip-chip light-emitting semiconductor dies 700B, further including a plurality of reflective structures 730 (for example, mixing light scattering particles such as titanium dioxide in an optically transparent resin material) disposed next to the flip-chip light-emitting semiconductor dies 720, respectively, to block and reflect lateral transmission of a primary light radiated from the flip-chip light-emitting semiconductor dies 720. Referring to FIG. 9C, other embodiments of the to-be-laminated substrate 700 may also be a light-transmitting substrate (or a wafer, a glass substrate or a ceramic substrate) 700C. Hereinafter, an array of flip-chip light-emitting semiconductor dies 700B as shown in FIG. 9B will be used as example embodiments of the to-be-laminated substrate 700.

Figure 9E:
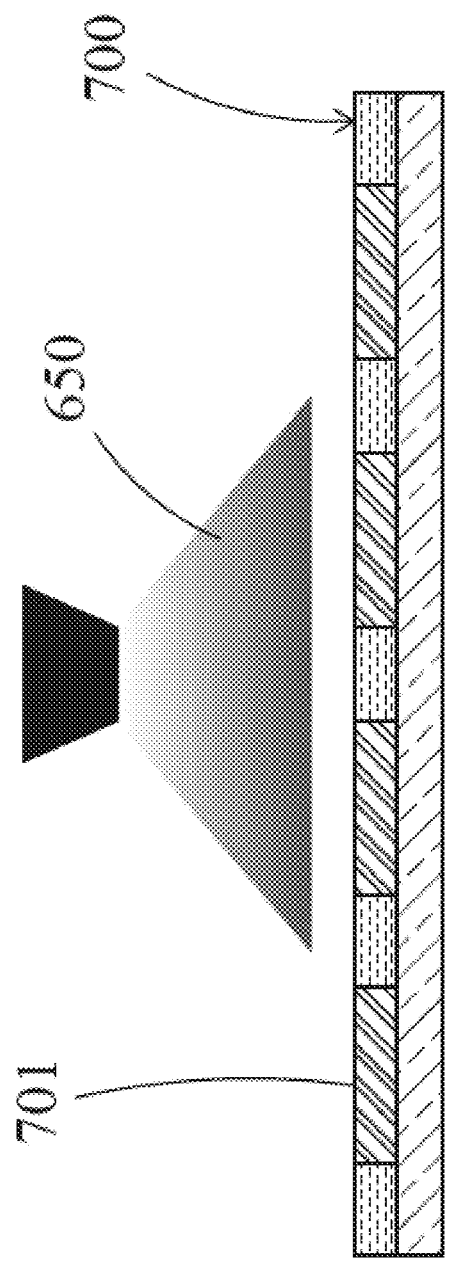

Referring to FIG. 9D, a substrate surface 701 of the to-be-laminated substrate 700 is preferably plasma-treated to clean the interface and activate chemical bonds on the substrate surface 701. Afterwards, as illustrated in FIG. 9E, the substrate surface 701 of the to-be-laminated substrate 700 is coated with an adhesive glue 650 by spraying, coating, printing, dispensing, etc. The material of the adhesive glue 650 may include silicone, resin, rubber, or the like. After the substrate surface 701 of the to-be-laminated substrate 700 is plasma treated, the adhesive glue 650 can form stronger chemical bonds with the substrate surface 701 to have an improved adhesion strength.

Figure 10:
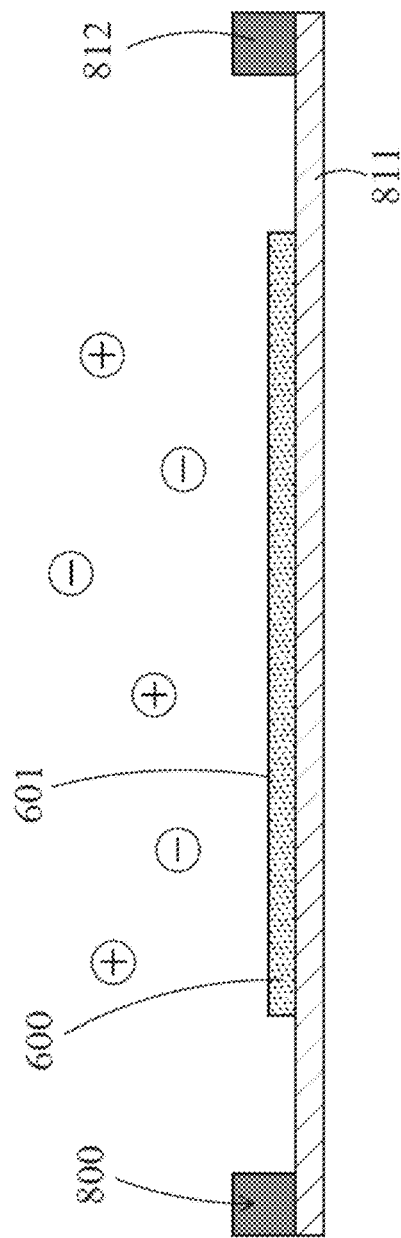

A laminating film 600 such as an optical film may be prepared similarly. Referring to FIG. 10, the laminating film 600 may include a variety of flexible or inflexible films such as a phosphor photo-luminescent film, a quantum-dot photo-luminescent film, a silicone photo-luminescent film, a resin film, and a ceramic photo-luminescent film. The phosphor photo-luminescent film or the quantum-dot photo-luminescent film can be fabricated by the methods disclosed in U.S. Pat. Nos. 9,797,041 and 9,210,763, the contents of which are incorporated herein by reference in their entireties. The photo-luminescent film is usually made of silicone as a binder material, and the silicone can be either partially cured B-stage silicone or fully cured C-stage silicone.

A film surface 601 of the laminating film 600 may also be plasma surface treated so that the adhesive glue 650 can have improved adhesion to the optical film 600. However, if the adhesion strength between the laminating film 600 (or the to-be-laminated substrate 700) and the adhesive glue 650 is sufficient, the plasma surface treatment can be omitted. In addition, the adhesive glue 650 may also be disposed on the surface 601 of the laminating film 600. The laminating film 600 can be temporarily adhered to the adhesive tape 811 of the holder frame 800, plasma surface treated, and then coated with the adhesive glue 650. The adhesive tape 811 is usually sticky by itself. Therefore, it is not necessary to apply an adhesive glue to attach the laminating film 600 onto the adhesive tape 811.

After the laminating film 600 and the to-be-laminated substrate 700 are ready to be laminated, the film laminating process can begin. First, referring to FIG. 11, the laminating film 600 and the to-be-laminated substrate 700 are placed properly on the substrate susceptor 310. The to-be-laminated substrate 700 can be placed in the recessed pocket 312 of the substrate susceptor 310, and the laminating film 600 is adhered to the holder frame 800, which is then placed on the substrate susceptor 310. At this time, the supporting frame 812 of the holder frame 800 is in contact with the substrate susceptor 310, and the adhesive tape 811 and the laminating film 600 are placed above the to-be-laminated substrate 700 with an initial distance D2. A recessed slot (not shown) may also be formed on the surface of the substrate susceptor 310 for better positioning of the supporting frame 812.

Referring to FIG. 2, before placing the laminating film 600 and the to-be-laminated substrate 700, the substrate susceptor 310 can be slid out of the chamber 110. After the laminating film 600 and the to-be-laminated substrate 700 are properly placed on the substrate susceptor 310, the substrate susceptor 310 is then slid back into the chamber 110. The susceptor presence sensor 340 and the film presence sensor 350 can be used to detect whether the substrate susceptor 310 is properly located under the film-pressing platen 210 and whether the laminating film 600 (or the holder frame 800) is correctly placed on the substrate susceptor 310, respectively.

Figure 12:
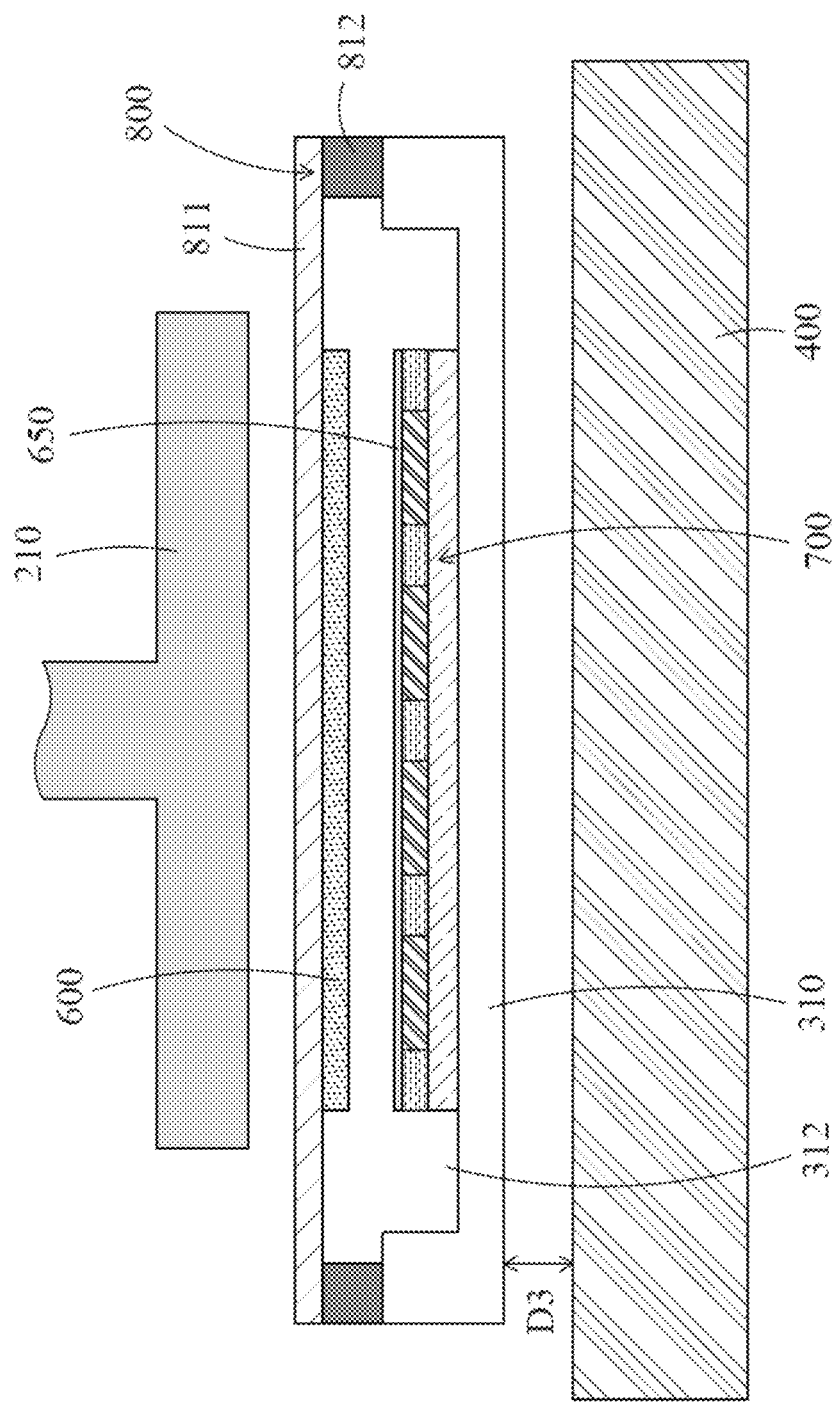

Referring to both FIG. 12 and FIG. 6A, after the laminating film 600 and the to-be-laminated substrate 700 have been placed on the substrate susceptor 310, the interior volume 110A of the chamber 110 is pumped down to a vacuum state, that is, through vacuum pressure control components assembly 130 to evacuate the interior volume 110A. The vacuum pressure may be about 50 Torr or less, about 10 Torr or less, or about 1 Torr or less. In this vacuum state, there is a trace amount of rarified gas trapped between the laminating film 600 and the to-be-laminated substrate 700.

In addition, when the chamber 110 is being evacuated, the film-pressing platen 210, the substrate susceptor 310 and the hot-plate heating module 400 are not in contact and separated vertically. That is, an initial distance D3 is maintained between the substrate susceptor 310 and the hot-plate heating module 400. At this time, the hot-plate heating module 400 is already heated up to a higher temperature (e.g., about 150 degrees Celsius), and the adhesive glue 650 on the substrate susceptor 310 will not be heated up to a curing temperature because a gap with the initial distance D3 above the hot-plate heating module 400 is maintained. Therefore, the adhesive glue 650 will not be cured before completing attachment of the film 600 to the substrate 700.

Figure 13A:
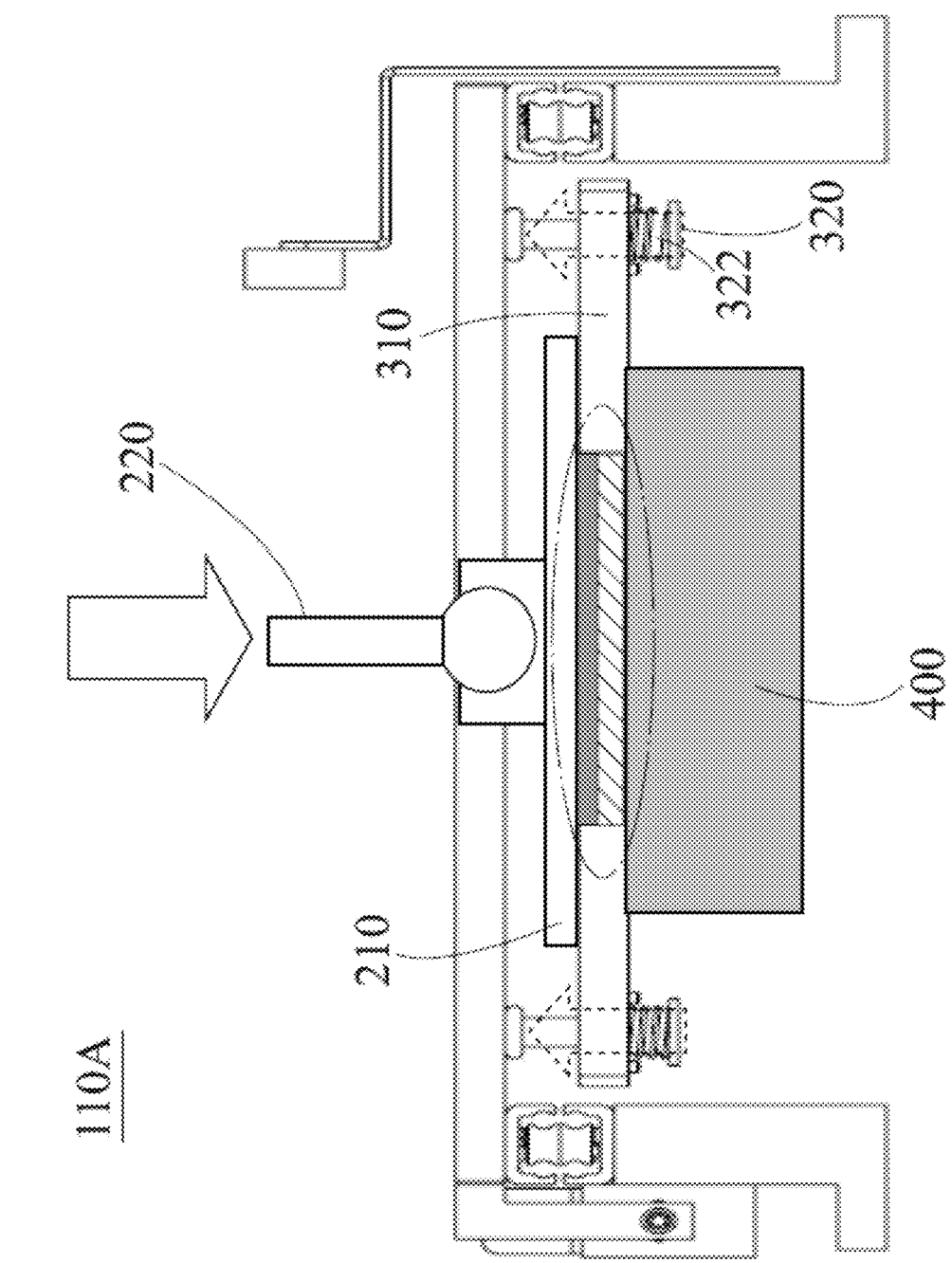
Figure 13B:
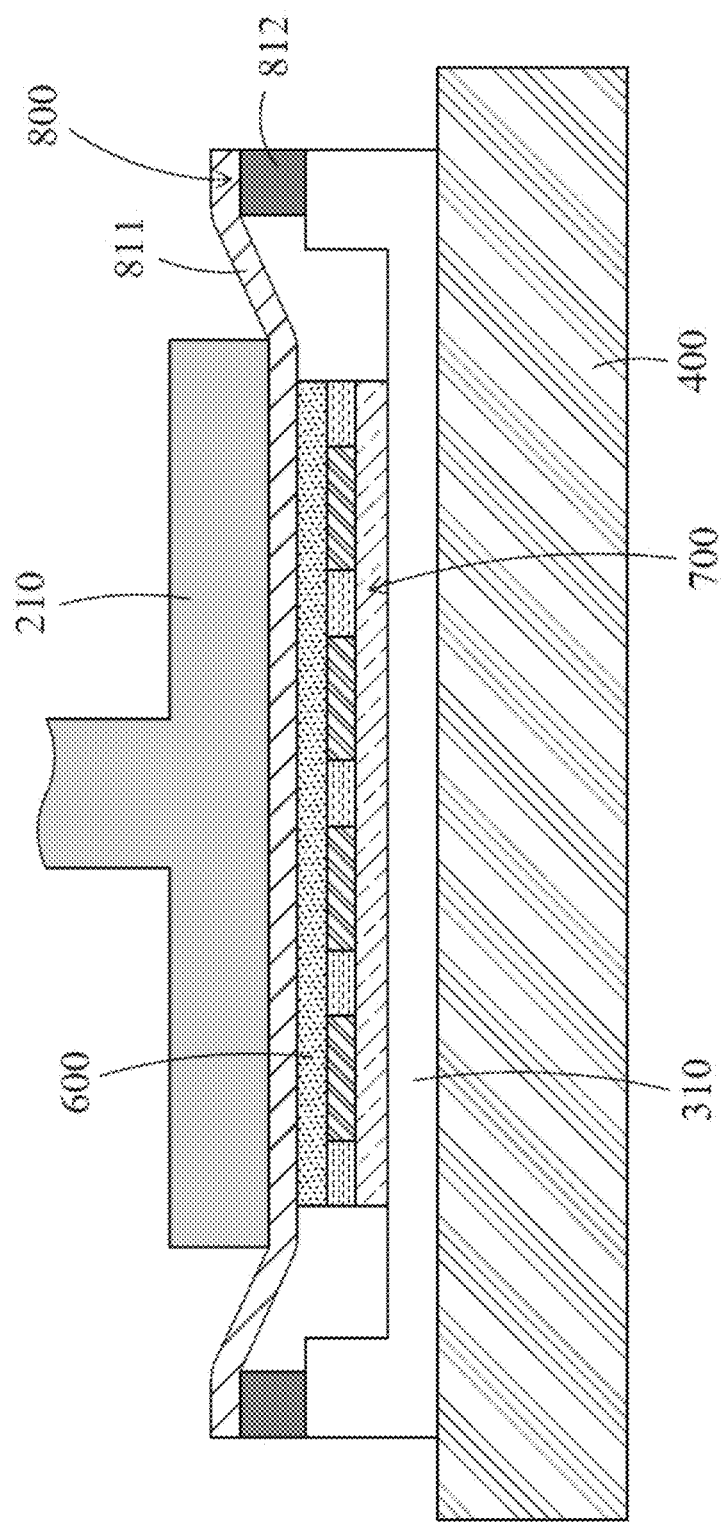

Referring to FIG. 13A and FIG. 13B (for the sake of simplicity, the adhesive glue 650 is omitted), after the interior volume 110A of the chamber 110 is in a vacuum state, the laminating film 600 and the to-be-laminated substrate 700 are attached together. Specifically, the sliding rod 220 is actuated by the pressing actuator 230 to move the film-pressing platen 210 downwards, and the film-pressing platen 210 presses the adhesive tape 811 and the laminating film 600 thereon so that the adhesive tape 811 is deformed downwards. Then the laminating film 600 and the to-be-laminated substrate 700 are attached together with the adhesive glue 650 sandwiched in between (not shown). The film-pressing platen 210 continues to move downwards until the substrate susceptor 310 is stopped by and rests on the hot-plate heating module 400. Meanwhile, the spring 322 of the spring-loaded mechanism 320 disposed under the substrate susceptor 310 will be compressed so that spring potential energy is stored.

After the substrate susceptor 310 is stopped against the hot-plate heating module 400, the substrate susceptor 310 is sandwiched between the film-pressing platen 210 and the hot-plate heating module 400. Heat of the hot-plate heating module 400 will be conducted to the substrate susceptor 310 so that the adhesive glue 650 between the laminating film 600 and the to-be-laminated substrate 700 can be thermally cured.

Figure 14A:
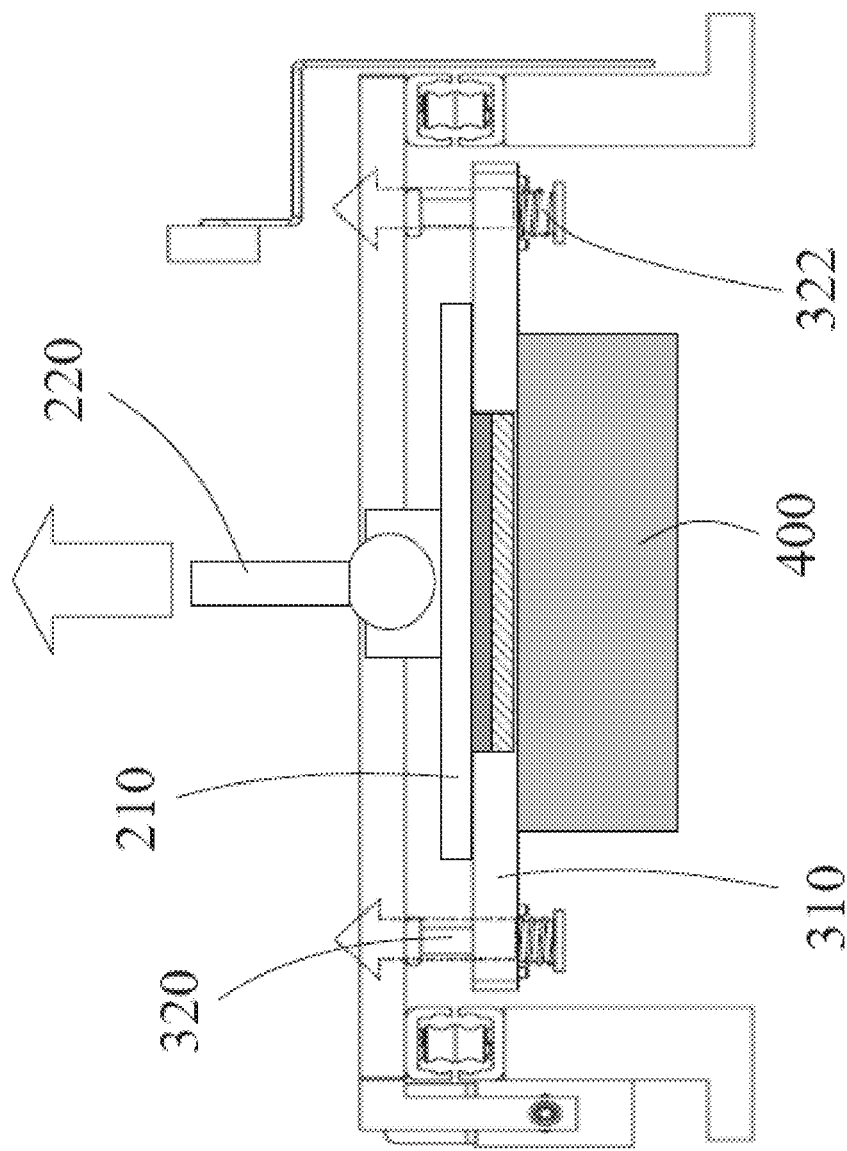
Figure 14B:
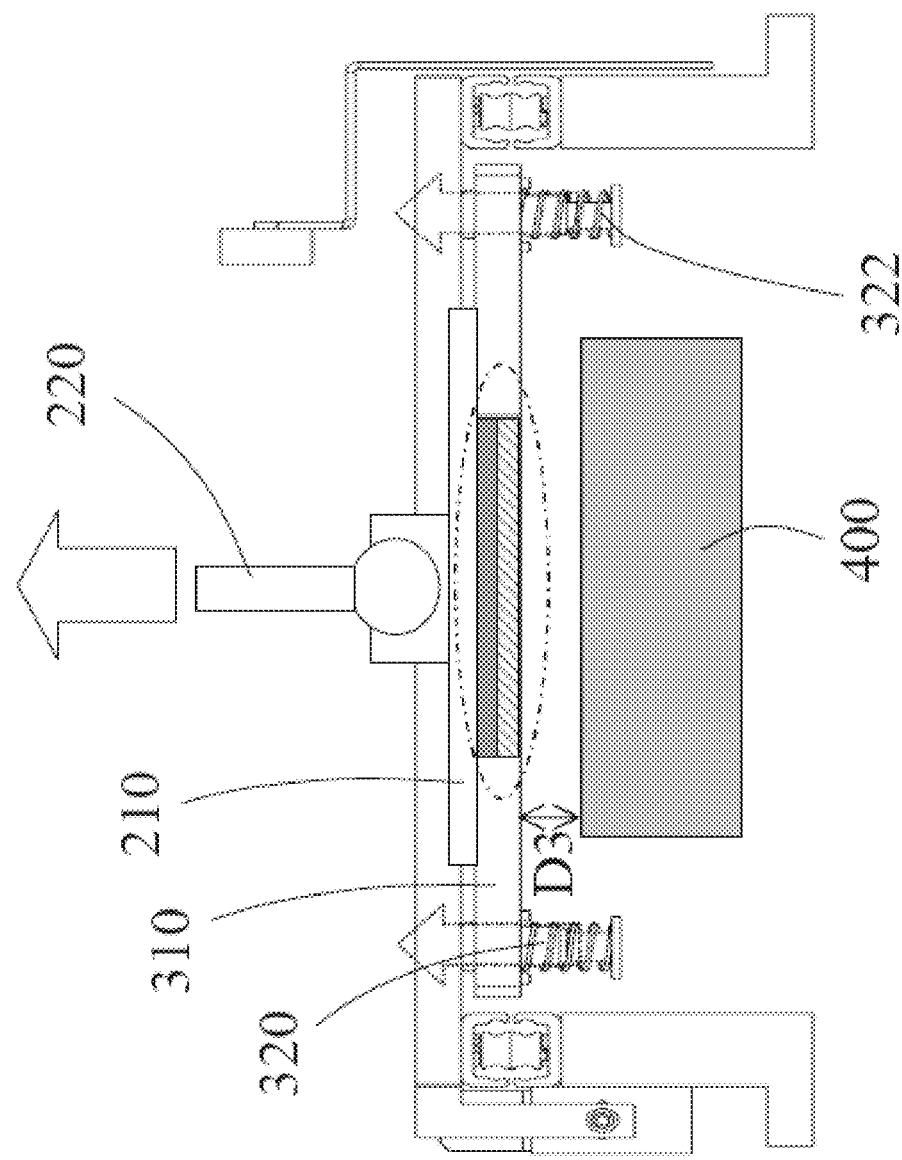

For the sake of simplicity of the drawings, the adhesive glue 650 in FIG. 14A and in drawings following FIG. 14A is omitted. Referring to FIG. 14A, after the adhesive glue 650 reaches a certain extent of curing to form substantial bonding strength between the film 600 and the substrate 700 after a prescribed amount of curing time, the sliding rod 220 together with the film-pressing platen 210 are actuated to move upwards to release pressing force onto the laminating film 600, the adhesive tape 811 and the substrate susceptor 310. Referring to FIG. 14B, the spring potential energy stored in the spring-loaded mechanism 320 during the previous pressing action will be released, and the substrate susceptor 310 is actuated to move upwards by the spring-loaded mechanism 320 and returns to the initial position. Therefore, the substrate susceptor 310 (together with the laminating film 600 and the to-be-laminated substrate 700 thereon) is separated from the hot-plate heating module 400 with the initial distance D3 so that the adhesive glue 650 will not continue to be thermally cured.

Figure 14C:
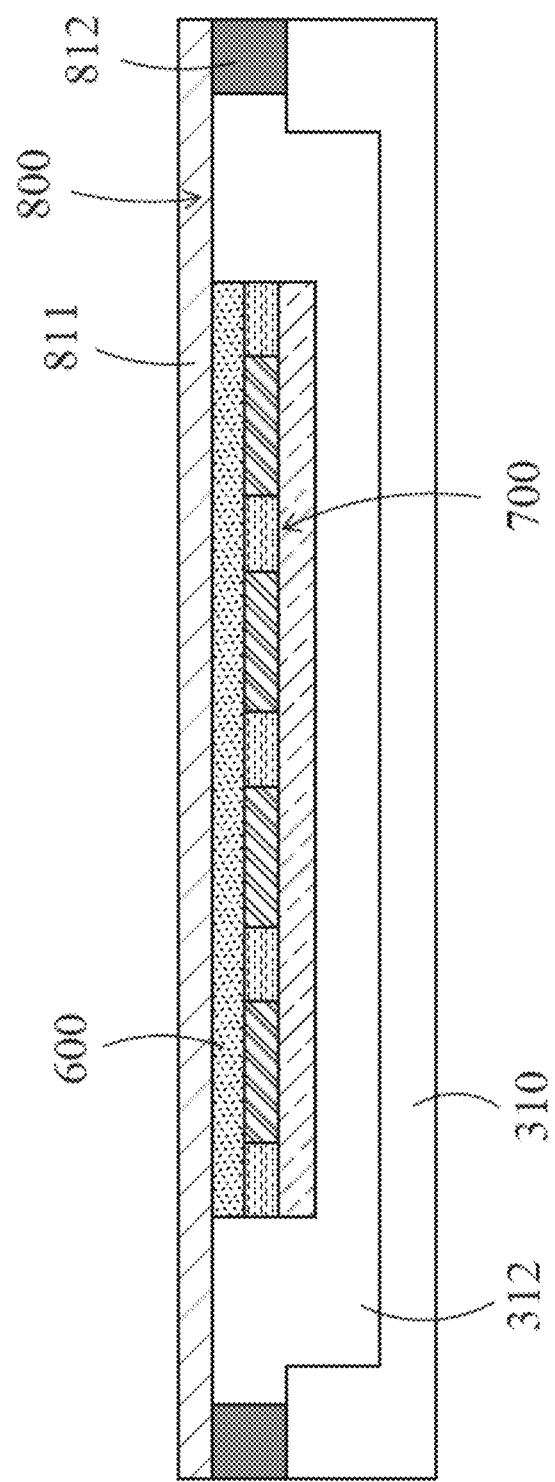
Figure 14D:
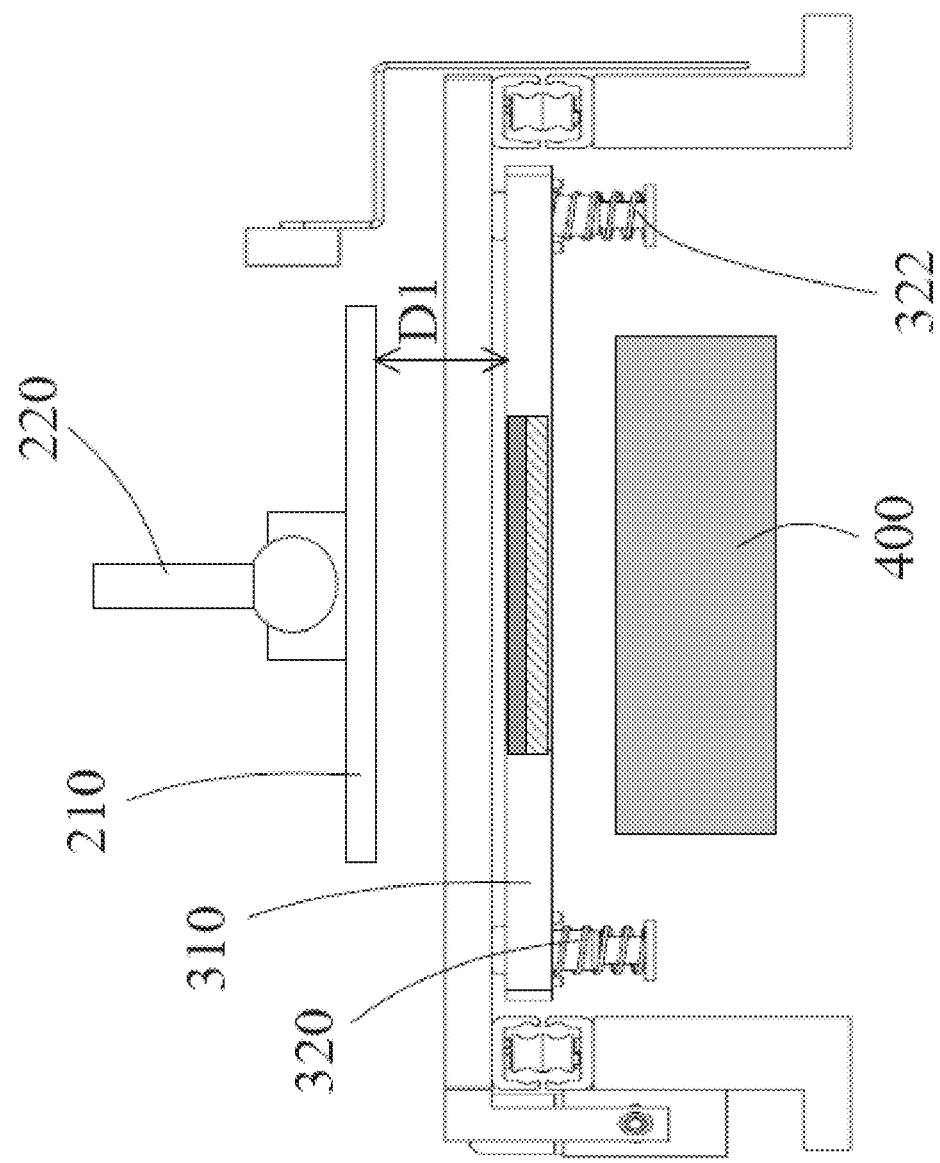

When the spring potential energy is released from the spring-loaded mechanism 320 stored during the previous pressing action, the film-pressing platen 210 moves upwards so that the substrate susceptor 310 is actuated and returned to the initial position. At this time, the vacuum film-lamination process is completed. As illustrated in FIG. 14C (where the adhesive glue 650 is omitted), desirably, the adhesive tape 811 is restored to its un-deformed state due to its own elastic tension force, and the laminating film 600 along with the to-be-laminated substrate 700 will also be lifted up from the substrate susceptor 310 to move along with the adhesive tape 811. That is, the to-be-laminated substrate 700 is separated from the substrate susceptor 310 and is no longer placed in the recessed pocket 312. Then, the film-pressing platen 210 continues to move up and back to maintain the initial distance D1 from the substrate susceptor 310, as shown in FIG. 14D.

After the laminating film 600 and the to-be-laminated substrate 700 move up and are separated from the hot-plate heating module 400, the interior volume 110A of the chamber is vented to the atmospheric pressure (e.g., about 760 Torr) by the venting pressure source 136 or the like. Thereafter, the chamber door 116 is opened, and the substrate susceptor 310 is slid to the outside of the chamber 110 so that the holder frame 800 from the substrate susceptor 310 can be removed. That is, the laminating film 600 and the to-be-laminated substrate 700 are removed along with the holder frame 800 to the outside of the chamber 110.

If the adhesive glue 650 between the laminating film 600 and the to-be-laminated substrate 700 is not completely cured, desirably, the laminating film 600 and the film to-be-laminated 700 are removed and then placed in another heating apparatus (e.g., oven), and the adhesive glue 650 can continue to be thermally cured so that the bonding adhesion between the laminating film 600 and the to-be-laminated substrate 700 can be further strengthened. Desirably, the heating apparatus can thermally cure the laminating film 600 and the to-be-laminated substrate 700 in a batch manner, so that the curing process is more cost effective.

However, the adhesive glue 650 can also be substantially fully cured thermally by using the hot-plate heating module 400 inside the vacuum film-lamination system 10 so that extra post-processing is not required after the laminating film 600 and the to-be-laminated substrate 700 are removed from the vacuum film-lamination system 10.

Figure 15A:
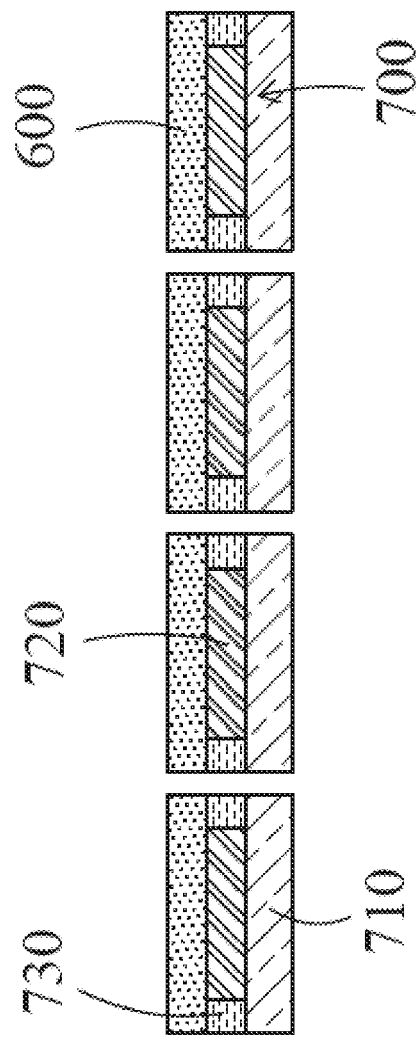
Figure 15B:
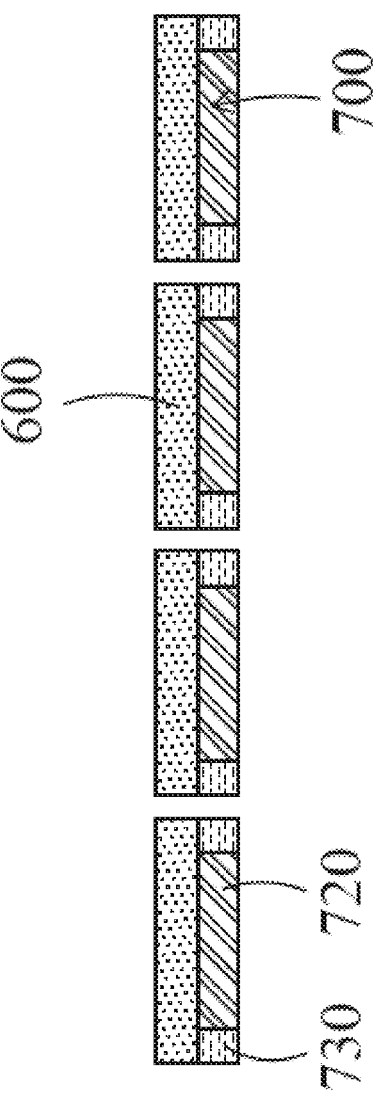

Referring to FIG. 15A, the array of light-emitting semiconductor dies 720 laminated with a phosphor film may be singulated by dicing to form a plurality of phosphor-converted light-emitting diode devices. Alternatively, referring to FIG. 15B, the array of light-emitting semiconductor dies 720 laminated with a phosphor film can be released from the tape substrate 710 first and then singulated by dicing.

Figure 16A:
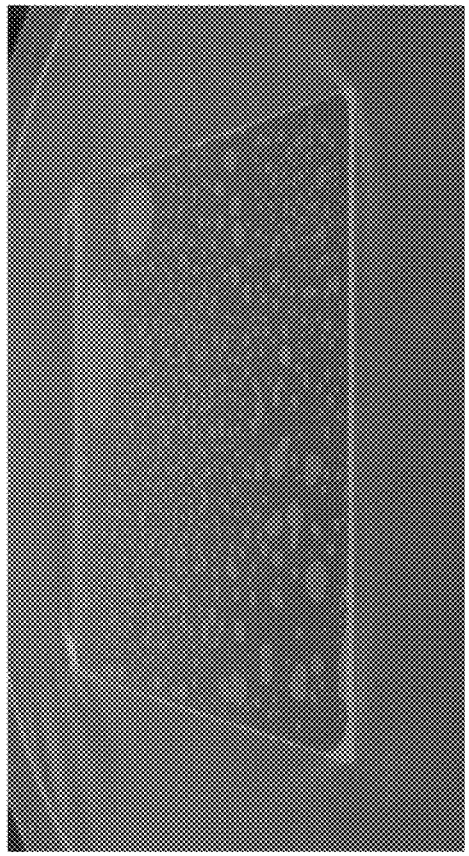
FIG. 16A shows a test result of a film-lamination process conducted under atmospheric pressure.
Figure 16B:
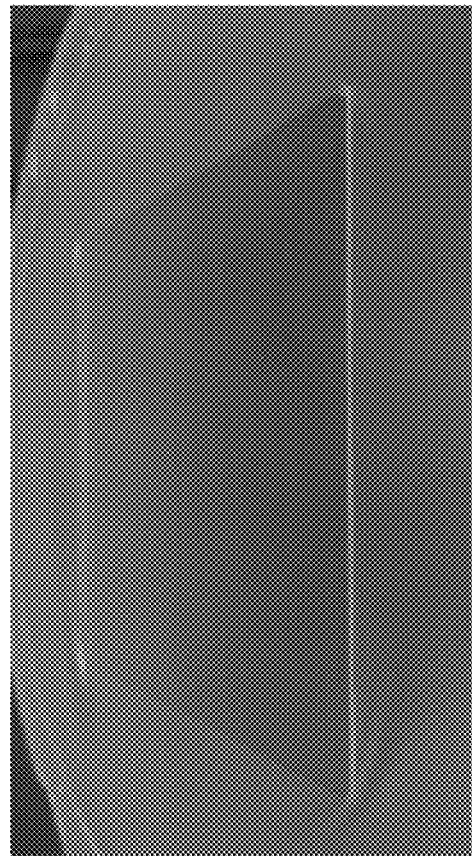
FIG. 16B shows a test result of a film-lamination process conducted using a vacuum film-lamination system.

Thus, a wafer-level bonding process between the laminating film 600 and the to-be-laminated substrate 700 can be performed in a vacuum state using the vacuum film-lamination system 10 to reduce the bubble defects that are commonly found using other lamination methods. Test results using a transparent silicone film and a glass substrate show that lamination of the silicone film onto the glass substrate in a vacuum state can effectively reduce the bubbles trapped in between. As shown in FIG. 16A, when the film and the substrate are laminated at atmospheric pressure environment, bubbles are inevitably trapped between the transparent silicone film and the glass substrate. On the other hand, FIG. 16B shows a lamination result using the vacuum film-lamination system 10 according to some embodiments of the present disclosure. There are no observable bubbles between the film and the substrate. Besides, the plasma surface treatment of the laminating film 600 and the to-be-laminated substrate 700 can be used for surface cleaning and surface chemical bond activation, thereby effectively increasing the bonding strength between the laminating film 600 and the to-be-laminated substrate 700 to further improve the bonding quality. Moreover, before the attachment, the substrate susceptor 310 and the hot-plate heating module 400 are separated with an initial distance D3, the adhesive glue 650 will not be pre-cured before the attachment process. Furthermore, the vacuum film-lamination system 10 can perform film lamination onto a plurality of components such as the flip-chip light-emitting semiconductor dies 720 simultaneously in a batch manner to achieve a wafer-level bonding process.

Figure 17:
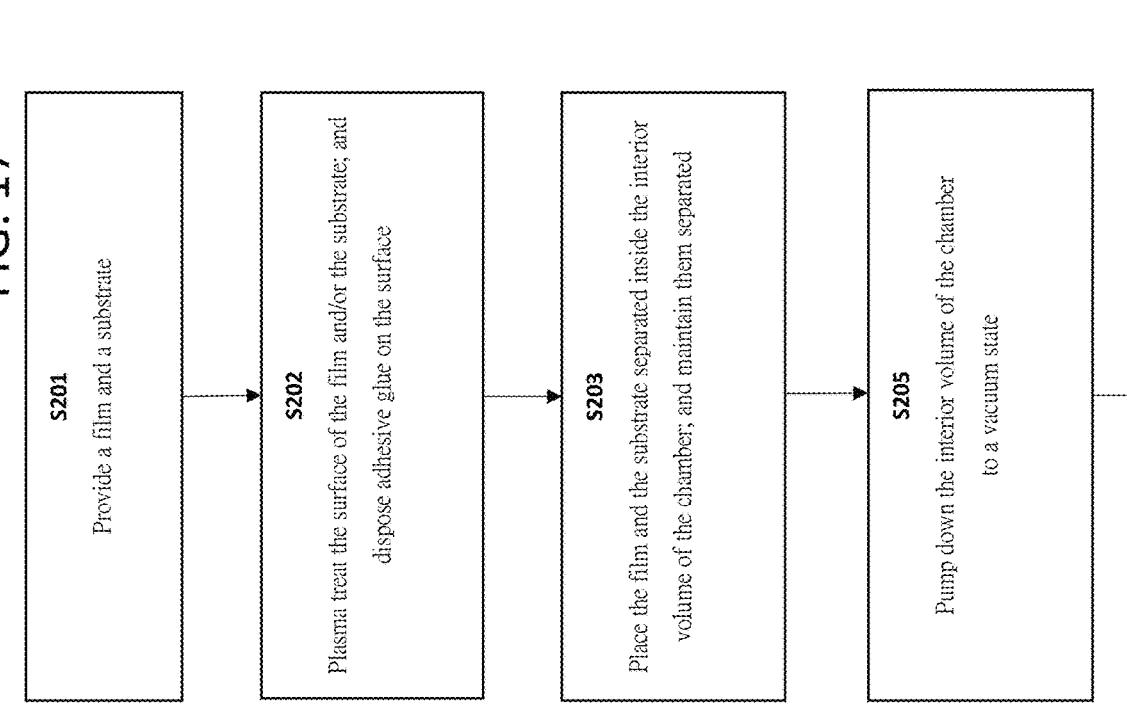
FIG. 17 is a flow chart showing manufacturing stages of a vacuum film-lamination method according to some embodiments of the present disclosure.

Referring to FIG. 17, a vacuum film-lamination method 20 according to some embodiments of the present disclosure is described below. The vacuum film-lamination method 20 can be implemented by using the vacuum film-lamination system 10 described above. Therefore, the vacuum film-lamination method 20 can be regarded as a method utilizing the vacuum film-lamination system 10. Therefore, the technical details of the vacuum film-lamination method 20 can refer to the technical content of the vacuum film-lamination system 10 for the purpose of brevity.

Figure 11:
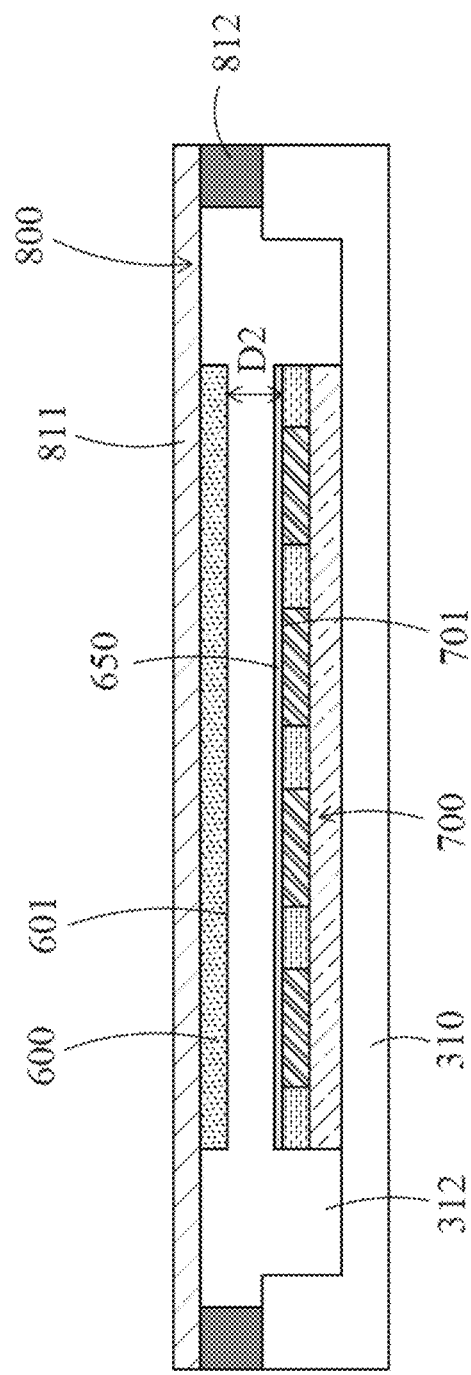

First, as shown in FIG. 11, a laminating film 600 and a to-be-laminated substrate 700 are provided (stage S201). At least one of the laminating film 600 and the to-be-laminated substrate 700 has been provided with an adhesive glue 650, and the film 600 and/or the to-be-laminated substrate 700 may be plasma-treated (stage S202).

Next, as shown in FIG. 12, the laminating film 600 and the to-be-laminated substrate 700 are maintained separated inside the interior volume 110A (stage S203), and then the interior volume 110A is evacuated to a vacuum state (stage S205).

Thereafter, as shown in FIG. 13A and FIG. 13B, the laminating film 600 is pressed in a vacuum state to be attached onto the to-be-laminated substrate 700 with the adhesive glue 650 sandwiched in between (stage S207). The film 600 and the substrate 700 are pressed to move downwards until they are stopped and rest on the hot-plate heating module 400 (stage S209). In this way, the adhesive glue 650 is thermally cured by the hot-plate heating module 400.

Next, as shown in FIG. 14A to FIG. 14D, after the adhesive glue 650 is cured to a certain extent, the laminated film 600 and the substrate 700 can be moved upwards and kept away from hot-plate heating module 400 to finish the adhesive curing process (stage S211). After that, the laminated film 600 and the substrate 700 are removed from the interior volume 110A, and then the adhesive glue 650 can be completely cured in another heating apparatus (stage S213).

In summary, the vacuum film-lamination system and method of some embodiments of the present disclosure can resolve the problem of the bubble defects between the laminating film and the to-be-laminated substrate, and improve the adhesion strength between the laminating film and the to-be-laminated substrate by avoiding the adhesive glue being cured prematurely before the film attachment process. This method has better manufacturing yield and allows wafer-level bonding, resulting in lower equipment costs and/or better production efficiency.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, or process to the objective, spirit and scope of the disclosure. All such modifications are intended to be within the scope of the claims appended hereto. In particular, while the methods disclosed herein have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not limitations of the disclosure.

What is claimed is:

1. A vacuum film-lamination system comprising:
a vacuum chamber module comprising a chamber defining an interior volume, and a pressure control components assembly configured to control a pressure inside the interior volume;
a film-pressing module connected to the chamber and comprising a film-pressing platen and a sliding rod, wherein the sliding rod comprises an upper rod portion and a lower rod portion, the film-pressing platen is connected to the lower rod portion of the sliding rod, and the film pressing platen is configured to be actuated to move vertically inside the interior volume of the chamber via the sliding rod;
a substrate susceptor module disposed in the chamber and comprising a substrate susceptor and a spring-loaded mechanism, wherein the substrate susceptor is disposed on the spring-loaded mechanism with an initial vertical position and maintains a first initial distance below the film-pressing platen before the film-pressing platen is actuated to move downwards, wherein the substrate susceptor is configured to carry a laminating film and a to-be-laminated substrate spaced apart from each other with a second initial distance, and at least one of the laminating film and the to-be-laminated substrate has an adhesive glue disposed thereon; and
a hot-plate heating module disposed in the interior volume of the chamber and maintaining a third initial distance below the substrate susceptor before the substrate susceptor is actuated to move downwards;
wherein the substrate susceptor is disposed in the interior volume of the chamber and is configured to be actuated to move downwards by the film-pressing platen such that the laminating film and the to-be-laminated substrate are attached via the adhesive glue in a vacuum state, and
wherein the spring-loaded mechanism is configured to support the substrate susceptor above the hot-plate heating module at the third initial distance and store a spring potential energy while the substrate susceptor is actuated to move downwards, the hot-plate heating module is configured to support and heat the substrate susceptor while the substrate susceptor is actuated to move downwards and contacts the hot-plate heating module such that the adhesive glue between the attached laminating film and the to-be-laminated substrate is thermally cured by the hot-plate heating module; and
wherein upon actuation of the film-pressing platen to move upwards, the spring-loaded mechanism is further configured to actuate the substrate susceptor to move upwards and returning to the initial vertical position by releasing the spring potential energy.

2. The vacuum film-lamination system according to claim 1, wherein the film-pressing module further comprises a spherical joint disposed on the lower rod portion of the sliding rod and the film-pressing platen is connected to the sliding rod through the spherical joint.

3. The vacuum film-lamination system according to claim 1, wherein the vacuum chamber module further comprises a vacuum feedthrough linear bearing, the upper rod portion of the sliding rod is disposed outside the interior volume of the chamber, and the lower rod portion of the sliding rod passing through the vacuum feedthrough linear bearing is disposed inside the interior volume of the chamber.

4. The vacuum film-lamination system according to claim 1, wherein the film-pressing platen comprises a softer lower platen as a buffer layer.

5. The vacuum film-lamination system according to claim 1, wherein the vacuum chamber module further comprises a chamber door disposed at a side of the chamber and configured to be actuated to open or seal the side.

6. The vacuum film-lamination system of claim 5, wherein the substrate susceptor module further comprises a sliding rail disposed in the chamber, where the substrate susceptor is disposed on the sliding rail and is configured to slide horizontally from inside of the interior volume of the chamber to outside of the chamber through an opening of the side.

7. The vacuum film-lamination system according to any one of the claims 1 to 6, further comprising a control module configured to control and coordinate operation of the vacuum chamber module, the film-pressing module, the substrate susceptor module and the hot-plate heating module.

8. The vacuum film-lamination system according to claim 1, wherein the substrate susceptor has a recessed pocket for accommodating the to-be-laminated substrate.

* * * * *